(12) United States Patent
Halimi

(10) Patent No.: US 11,280,651 B2
(45) Date of Patent: Mar. 22, 2022

(54) THIN FILM THERMAL MASS FLOW SENSOR IN FLUID APPLICATIONS

(71) Applicant: Flo Technologies, Inc., Culver City, CA (US)

(72) Inventor: Henry M. Halimi, Los Angeles, CA (US)

(73) Assignee: Flo Technologies, Inc., Culver City, CA (US)

( * ) Notice: Subject to any disclaimer, the term of this patent is extended or adjusted under 35 U.S.C. 154(b) by 0 days.

(21) Appl. No.: 16/829,339

(22) Filed: Mar. 25, 2020

(65) Prior Publication Data

US 2020/0309582 A1 Oct. 1, 2020

Related U.S. Application Data

(60) Provisional application No. 62/823,641, filed on Mar. 25, 2019.

(51) Int. Cl.
*G01F 1/692* (2006.01)
*G01F 1/684* (2006.01)
(Continued)

(52) U.S. Cl.
CPC .............. *G01F 1/692* (2013.01); *G01F 1/68* (2013.01); *G01F 1/684* (2013.01); *G01F 1/6845* (2013.01);
(Continued)

(58) Field of Classification Search
CPC ........ G01F 1/692; G01F 1/6845; G01F 1/684; G01F 1/6847; G01F 1/68; G01F 1/69; H05K 2201/10151
See application file for complete search history.

(56) References Cited

U.S. PATENT DOCUMENTS 2,930,136 A 3/1960 Knudsen
3,085,781 A 4/1963 La Pointe
(Continued)

FOREIGN PATENT DOCUMENTS

CN 1846118 A * 10/2006 ........... G01F 1/6845
CN 106461440 A * 2/2017 ............. H01C 1/028
(Continued)

OTHER PUBLICATIONS

Johnson Controls, Inc. Vales and Actuators Catalog, 2014, https://www.johnsoncontrols.com/buildings/hvac-controls/valves-and-actuators.

*Primary Examiner* — Ryan D Walsh
(74) *Attorney, Agent, or Firm* — Hackler Daghighian Martino & Novak

(57) ABSTRACT

A flow sensor configured to detect a fluid flow of a liquid inside a pipe portion is disclosed. A thin film thermal mass flow sensor has a substrate defining a thickness from an upper side opposite a bottom side. The upper side of the substrate supports a resistive heating circuit, a first temperature sensor circuit and a second temperature sensor circuit. The resistive heating circuit is disposed between the first and second temperature sensor circuits. The circuits are electrically connected respectively to a plurality of leadwires configured to be attachable to electronic equipment. A thermally conductive membrane is configured to separate the fluid flow of the liquid inside the pipe portion from the thin film thermal mass flow sensor. A thermally conductive bond connects the bottom side of the substrate of the thin film thermal mass flow sensor to the thermally conductive membrane.

4 Claims, 15 Drawing Sheets

(51) Int. Cl.
  *G01F 1/69* (2006.01)
  *G01F 1/68* (2006.01)
(52) U.S. Cl.
  CPC .............. *G01F 1/6847* (2013.01); *G01F 1/69* (2013.01); *H05K 2201/10151* (2013.01)

(56) References Cited

U.S. PATENT DOCUMENTS

| | | | |
|---|---|---|---|
| 3,651,544 A | 3/1972 | Soma |
| 4,313,595 A | 2/1982 | Markley et al. |
| 4,418,712 A | 12/1983 | Braley |
| 4,488,567 A | 12/1984 | Grant |
| 4,546,671 A | 10/1985 | Fry |
| 4,637,423 A | 1/1987 | Gray |
| 4,658,651 A | 4/1987 | Le |
| 4,719,939 A | 1/1988 | Killian |
| 5,038,268 A | 8/1991 | Krause |
| 5,038,821 A | 8/1991 | Maget |
| 5,158,483 A | 10/1992 | Fishman et al. |
| 5,600,071 A | 2/1997 | Sooriakumar |
| 5,660,198 A | 8/1997 | McClaran |
| 5,821,636 A | 10/1998 | Baker |
| 5,927,400 A | 7/1999 | Bononi et al. |
| 5,971,011 A | 10/1999 | Price |
| 6,161,568 A | 12/2000 | Dragotta |
| 6,206,337 B1 | 3/2001 | Veillet, Jr. |
| 6,209,576 B1 | 4/2001 | Davis |
| 6,539,968 B1 | 4/2003 | White |
| 6,581,484 B1 | 6/2003 | Schuler |
| 6,662,821 B2 | 12/2003 | Jacobsen et al. |
| 6,701,951 B1 | 3/2004 | Drinkwater |
| 6,789,411 B2 | 9/2004 | Roy |
| 6,963,808 B1 | 11/2005 | Addink et al. |
| 6,994,309 B2 | 2/2006 | Fernandez-Sein |
| 7,066,192 B1 | 6/2006 | Delaney et al. |
| 7,119,698 B2 | 10/2006 | Schleich et al. |
| 7,284,435 B2 | 10/2007 | Ueno |
| 7,304,587 B2 | 12/2007 | Boaz |
| 7,317,404 B2 | 1/2008 | Cumeralto et al. |
| 7,330,796 B2 | 2/2008 | Addink et al. |
| 7,360,413 B2 | 4/2008 | Jeffries et al. |
| 7,383,721 B2 | 6/2008 | Parsons et al. |
| 7,426,875 B1 | 9/2008 | McMillan |
| 7,920,983 B1 | 4/2011 | Peleg et al. |
| 7,966,099 B2 | 6/2011 | Fima |
| 7,969,318 B2 | 6/2011 | White et al. |
| 8,347,427 B2 | 1/2013 | Klicpera |
| 8,701,703 B2 | 4/2014 | Scott et al. |
| 8,857,466 B1 | 10/2014 | Wilson |
| 8,887,324 B2 | 11/2014 | Klicpera |
| 9,016,662 B2 | 4/2015 | Staffiere et al. |
| 9,019,120 B2 | 4/2015 | Broniak et al. |
| 9,266,136 B2 | 2/2016 | Klicpera |
| 9,297,150 B2 | 3/2016 | Klicpera |
| 9,494,480 B2 | 11/2016 | Klicpera |
| 9,749,792 B2 | 8/2017 | Klicpera |
| 9,857,805 B2 | 1/2018 | Halimi |
| 2005/0016592 A1 | 1/2005 | Jeromson et al. |
| 2006/0028355 A1 | 2/2006 | Patterson et al. |
| 2006/0202051 A1 | 9/2006 | Parsons et al. |
| 2007/0068225 A1 | 3/2007 | Brown |
| 2007/0289635 A1 | 12/2007 | Ghazarian et al. |
| 2008/0300803 A1 | 12/2008 | Drake et al. |
| 2010/0212748 A1 | 8/2010 | Davidoff |
| 2011/0114202 A1 | 5/2011 | Goseco |
| 2011/0132085 A1 | 6/2011 | Chiou |
| 2011/0178644 A1 | 7/2011 | Picton |
| 2011/0303311 A1 | 12/2011 | Klicpera |
| 2011/0308320 A1 | 12/2011 | Rocznik |
| 2013/0036796 A1 | 2/2013 | Fleury, Jr. |
| 2013/0047736 A1 | 2/2013 | Papadeas |
| 2013/0218174 A1 | 8/2013 | Bjerken |
| 2013/0248045 A1 | 9/2013 | Williams |
| 2013/0306157 A1 | 11/2013 | Aylon |
| 2014/0130878 A1 | 5/2014 | Marinez |
| 2014/0230924 A1 | 8/2014 | Kochan, Jr. |
| 2014/0230925 A1 | 8/2014 | Halimi |
| 2014/0264111 A1 | 9/2014 | Porter |
| 2014/0306828 A1 | 10/2014 | Trescott |
| 2014/0341255 A1 | 11/2014 | Kaiser |
| 2015/0348395 A1 | 12/2015 | Trout |
| 2017/0153138 A1* | 6/2017 | Ike .................. G01F 1/699 |
| 2018/0136673 A1 | 5/2018 | Halimi |

FOREIGN PATENT DOCUMENTS

| | | | |
|---|---|---|---|
| DE | 19610885 A1 * | 9/1997 | ............ G01N 25/18 |
| DE | 196 26 083 A1 | 1/1998 | |
| EP | 1992917 A2 * | 11/2008 | ............ G01F 1/699 |
| GB | 2 499 059 A | 8/2013 | |
| JP | 07197236 A * | 8/1995 | |
| WO | WO-2004046659 A1 * | 6/2004 | ............ G01F 1/6845 |
| WO | 2013179019 A1 | 12/2013 | |

* cited by examiner

THIN FILM THERMAL MASS FLOW SENSOR IN FLUID APPLICATIONS

CROSS-REFERENCE TO RELATED APPLICATIONS

This non-provisional application claims priority to 62/823,641, filed Mar. 25, 2019, the entire contents of which are hereby incorporated in full by this reference.

DESCRIPTION

Field of the Invention

The present invention generally relates to flow sensor for liquids. More particularly, the present invention relates to a thin film thermal mass flow sensor in fluid application which can desirably detect low flow rates.

Background of the Invention

Many plumbing systems do not have an on-line flow meter/sensor. In some systems, when a flow meter/sensor is installed on-line, low magnitude flow leaks oftentimes fall below the low flow detection threshold of the flow sensors/meters in these systems. As a general rule known to those skilled in the art, as a pipe section (diameter) of a flow meter increases, the low flow sensitivity of that meter is compromised. Hence, in larger pipe sizes it becomes more challenging to detect such minimal flows.

FIG. 1 is a sectional side view showing a simplistic representation of a pipe portion 22 containing a fluid flow 23 of a liquid 24 in the flow direction 13 along a longitudinal axis 25. The fluid flow 23 is shown having a curved distribution where the liquid moving at the center of the pipe portion 22 moves faster than the liquid moving near the outer diameter. This is due to the liquid 24 interacting with the inner surface 26 of the pipe portion 22. Accordingly, it is generally considered beneficial to have the sensor located in the middle of the pipe, however, care must be taken to prevent turbulence from the use of various support structures which could affect measurements.

Detection of a low magnitude flow leak has been performed in the art by either a pressure decay test or the use of a bypass loop. As is shown in FIG. 2, a pressure decay test can be applied to a plumbing system 1. The plumbing system comprises a series of pipes 2 that take an input pipe 3 and branch it out by routing it to various fixtures 4. For example, fixtures 4 can be toilets 5, bathtub 6, sinks 7 and showers 8. As is appreciated by those skilled in the art, this plumbing system is a very simplistic view for illustrative purposes and in reality could be much more complicated. What is important is that a leak may develop along the pipes 2 or at any one of these fixtures 4. The arrow 13 designates the direction of the fluid flow in the pipes.

The pressure decay test is done by trapping pressurized fluid in the system by means of shutting off a valve 10 and monitoring the pressure of the fluid in the contained system by a pressure sensor 12. If there is a leak, the pressure in the system will lessen over time. It is this pressure drop that then signals a leak is present. This test is reliable to detect leaks but requires the installation of the valve and pressure sensor and also requires the interruption of fluid flow which often requires long monitoring time. Therefore, this system cannot detect leaks when in use and is not a real-time process.

Another method to detect minimal flow leaks is with the use a bypass loop 14 and a check valve 16 as shown in FIG. 3. FIG. 3 is a simplified schematic of a portion of a pipe 2 showing the check valve 16 as represented by the commonly used check valve symbol, but in reality it could be any type of check valve understood and used by those skilled in the art. The purpose of the check valve 16 is to bias the fluid flow through the bypass loop 14 for very low flow rates. As can be seen, the bypass loop 14 is much smaller in flow capacity in comparison to pipe 2. Then, depending on the cracking pressure of the check valve, when the flow rate dramatically increased, the check valve 16 would open and fluid would flow through the larger pipe 2. Alternatively, the check valve described herein can be substituted by any mechanical or actuated device that reacts to flow quantity or pressure variations through the bypass loop, such as synchronized valve operated by a microprocessor or microcontroller. As used herein, cracking pressure is the minimum upstream pressure required to open a check valve enough to allow detectable flow. Detectable flow is when the check valve allows a small but steady flow of liquid and/or gas to pass through the valve body and out through its outlet port.

Again, depending on the size of the pipe section 2, specifications of the check valve 16 and the maximum allowable flow through the bypass loop 14 at line pressure ("Bypass Max Flow"), the check valve 16 stays closed for flows below the Bypass Max Flow rates and this forces the flow to run through the bypass loop. Now, a sensitive flow meter/sensor 18 is located in the bypass loop and can detect this small flow.

There are many sensor options 18 commercially available for detection of low flow rates across the bypass loop. These range from simple turbine meters to sophisticated electronic metering devices such as ultrasonic meters, magnetic meters and the like.

SUMMARY OF THE INVENTION

FIGS. 4-9 show one embodiment of a flow sensor 30 that is configured to detect a fluid flow 23 of a liquid 24 inside a pipe portion 22. The fluid flow is configured to move in a flow direction 13 along a longitudinal axis 25 of the pipe portion. The flow sensor comprises a thin film thermal mass flow sensor 31 having a substrate 32 defining a thickness 29 from an upper side 33 opposite a bottom side 34. The upper side of the substrate supports a resistor (heater) circuit 35, a first temperature sensor circuit 36 and a second temperature sensor circuit 37. The resistive heating circuit 35 is disposed between the first and second temperature sensor circuits 36 and 37. It is understood that the resistive heating circuit is a heating circuit that heats up due to the passing of an electric current through the conductor. The operation of the resistive heating circuit 35 may be very complicated depending on the algorithms controlling its use, which can include the heater excitation, timing, intensity, interval periods and so forth. Furthermore, the first and second temperature circuits 36 and 37 are part of a bridge circuit. Additionally, a fluid media temperature sensing circuit 44 is also disposed on the circuit. In some embodiments the fluid media temperature sensing circuit 44 could be eliminated.

The circuits are electrically connected respectively to a plurality of leadwires 38 configured to be attachable to electronic equipment 39. A thermally conductive membrane 40 is configured to separate the fluid flow of the liquid inside the pipe portion from the thin film thermal mass flow sensor. A thermally conductive bond 45 connects the bottom side of the substrate of the thin film thermal mass flow sensor to the thermally conductive membrane.

In other exemplary embodiments, the substrate may comprise a ceramic substrate, the thermally conductive bond may comprise gold and the thermally conductive membrane may comprise a metal such as stainless steel. The resistive heating circuit, the first temperature sensor circuit and the second temperature sensor circuit may comprise platinum. Additionally, the lower side of the substrate may comprise a metal vapor deposition.

In an embodiment, a thickness of the thermally conductive membrane may be equal to or less than 0.5 mm, 0.25 mm or 0.1 mm.

In one embodiment, the thin film thermal mass flow sensor 31 may be disposed in a sensor housing 50, the sensor housing configured to be attached to the pipe portion containing the fluid flow of the liquid. The sensor housing may be integrally formed as part of the pipe portion as seen in FIG. 6, or the sensor housing may be removably attachable to the pipe portion as seen in FIGS. 7, 8 and 9.

In one embodiment, the thermally conductive membrane may be configured to be disposed adjacent to an inside surface of the pipe portion. Alternatively, the thermally conductive membrane may be configured to be disposed at a center of the fluid flow of the liquid inside the pipe portion.

In one embodiment, the thin film thermal mass flow sensor may be configured to be oriented with respect to the flow direction where the fluid flow first reaches the first temperature sensor circuit, next reaches the resistive heating circuit and finally reaches the second temperature circuit.

As best shown in FIGS. 10-15, another exemplary embodiment of a flow sensor 30 is disclosed. The flow sensor is configured to detect a fluid flow 23 of a liquid 24 inside a pipe portion 22, the fluid flow configured to move in a flow direction 13 along a longitudinal axis 25 of the pipe portion. The flow sensor comprises a thin film thermal mass flow sensor 31 having a substrate 32 defining a thickness 29 from an upper side 33 opposite a bottom side 34. The upper side of the substrate supports a resistive heating circuit 35, a first temperature sensor circuit 36 and a second temperature sensor circuit 37. The resistive heating circuit is configured to be the heater circuit, where it can heat the fluid flow in contact with it through resistive (ohmic) heating. The resistive heating circuit is disposed between the first and second temperature sensor circuits. All of the circuits are electrically connected respectively to a plurality of leadwires 38 configured to be attachable to electronic equipment 39. A conformal coating is disposed over the thin film thermal mass flow sensor, wherein the conformal coating is electrically insulative and thermally conductive.

In certain embodiments described herein, the thin film thermal mass flow sensor may be configured to be oriented with respect to the flow direction where the fluid flow first reaches the first temperature sensor circuit, next reaches the resistive heating circuit and finally reaches the second temperature circuit. It is understood by those skilled in the art that the thin film thermal mass flow sensor is bidirectional in that depending on the temperature change read by the temperature circuits a flow direction can be determined. Therefore, the thin film thermal mass flow sensor can be installed in an opposite orientation and still work according to this disclosure.

In one embodiment, a funnel may be disposed inside the piper portion and located upstream of the thin film thermal mass flow sensor.

In one embodiment, a support structure may hold the thin film thermal mass flow sensor at a center of the fluid flow of the liquid inside the pipe portion, where the support structure is not being disposed upstream of the circuits.

Other features and advantages of the present invention will become apparent from the following more detailed description, when taken in conjunction with the accompanying drawings, which illustrate, by way of example, the principles of the invention.

BRIEF DESCRIPTION OF THE DRAWINGS

The accompanying drawings illustrate the invention. In such drawings.

DETAILED DESCRIPTION OF THE PREFERRED EMBODIMENTS

Figure 1:
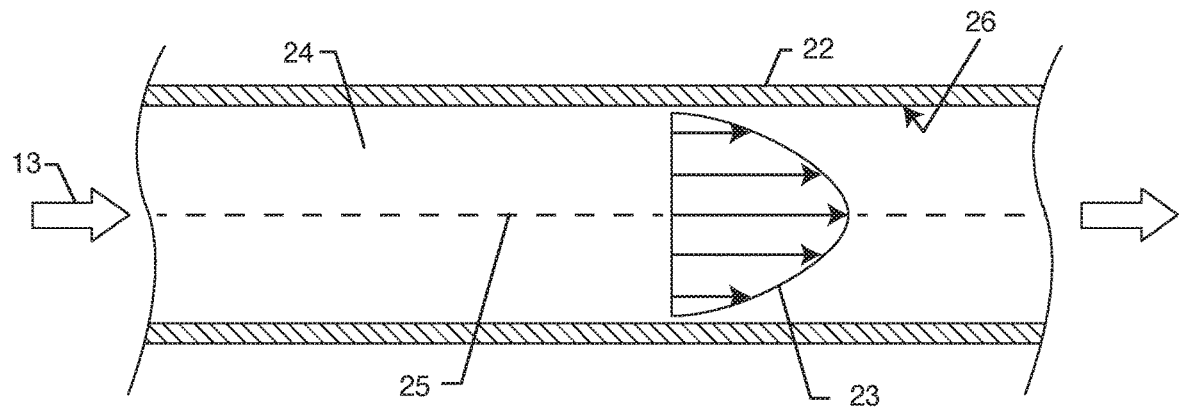
FIG. 1 is a sectional side view depicting a pipe portion and its associated inner fluid flow.
Figure 2:
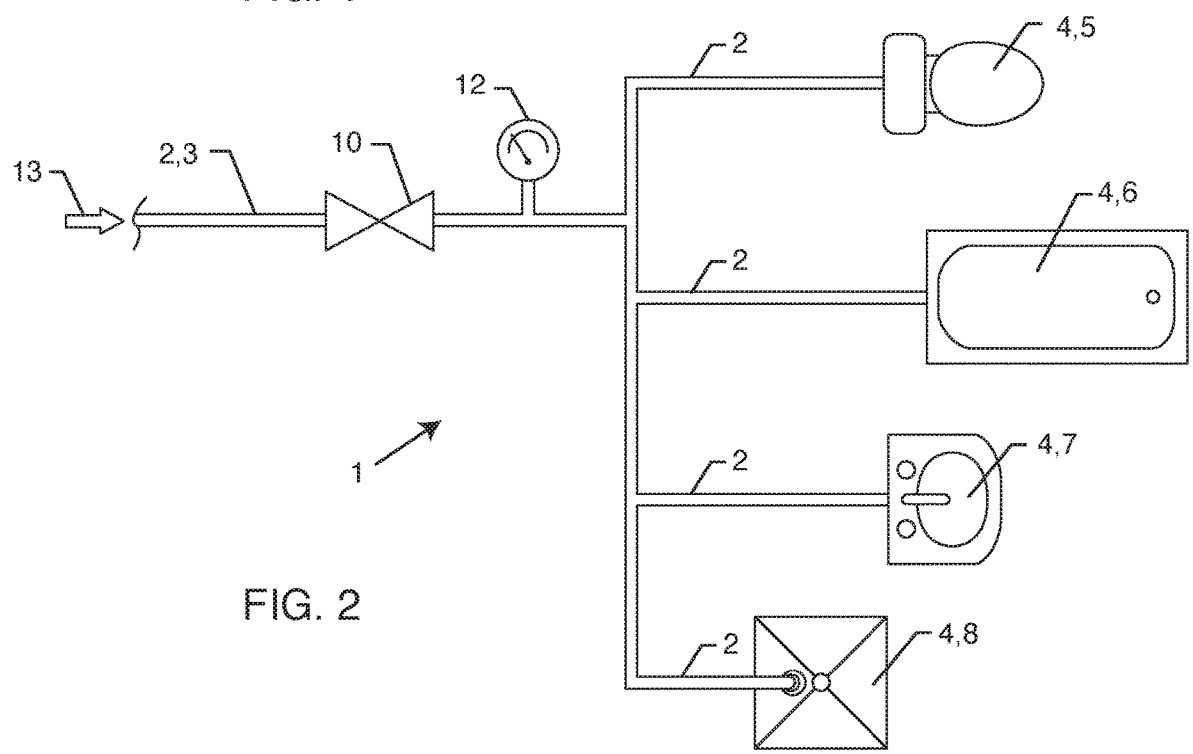
FIG. 2 is a simplified plumbing schematic illustrating a system for a pressure decay test.

This Detailed Description merely describes exemplary embodiments of the invention and is not intended to limit the scope of the claims in any way. Indeed, the invention as claimed is broader than and unlimited by the embodiments shown herein, and the terms used in the claims have their full ordinary meaning. For example, while exemplary embodiments described in this disclosure relate to use of a fluid usage monitoring system for measurement and control of water usage in a plumbing system, it is to be understood that one or more of the features described herein may additionally or alternatively be applied to other water system or to other fluid systems, such as, for example, natural gas, air, propane, steam, oil, gas, or other such fluid systems.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, circuits, devices and components, software, hardware, control logic, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure, however, such values and ranges are not to be construed in a limiting sense and are intended to be critical values or ranges only if so expressly stated. Parameters identified as "approximate" or "about" a specified value in the claims are intended to include both the specified value and values within 10% of the specified value, unless expressly stated otherwise. Further, it is to be understood that the drawings accompanying the present disclosure may, but need not, be to scale, and therefore may be understood as teaching various ratios and proportions evident in the drawings. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention, the inventions instead being set forth in the appended claims. Descriptions of exemplary methods or processes are not limited to inclusion of all steps as being required in all cases, nor is the order that the steps are presented to be construed as required or necessary unless expressly so stated.

"Computer," "controller," "control module," or "processor" as used herein includes, but is not limited to, any programmed or programmable electronic device or coordinated devices that can store, retrieve, and process data and may be a processing unit or in a distributed processing configuration. Examples of processors include microprocessors, microcontrollers, graphics processing units (GPUs), floating point units (FPUs), reduced instruction set computing (RISC) processors, digital signal processors (DSPs), field programmable gate arrays (FPGAs), etc. Computer devices herein can have any of various configurations, such as handheld computers (e.g., so-called smart phones), pad computers, tablet laptop computers, desktop computers, and other configurations, and including other form factors. The various computers and processors herein have logic for performing the various corresponding functions and processes described herein. "Logic," synonymous with "circuit" as used herein includes, but is not limited to, hardware, firmware, software and/or combinations of each to perform one or more functions or actions. For example, based on a desired application or needs, logic may include a software controlled processor, discrete logic such as an application specific integrated circuit (ASIC), programmed logic device, or other processor. Logic may also be fully embodied as software. "Software," as used herein, includes but is not limited to one or more computer readable and/or executable instructions that cause a processor or other electronic device to perform functions, actions, processes, and/or behave in a desired manner. The instructions may be embodied in various forms such as routines, algorithms, modules or programs including separate applications or code from dynamically linked libraries (DLLs). Software may also be implemented in various forms such as a stand-alone program, a web-based program, a function call, a subroutine, a servlet, an application, an app, an applet (e.g., a Java applet), a plug-in, instructions stored in a memory, part of an operating system, or other type of executable instructions or interpreted instructions from which executable instructions are created. It will be appreciated by one of ordinary skill in the art that the form of software is dependent on, for example, requirements of a desired application, the environment it runs on, and/or the desires of a designer/programmer or the like. In exemplary embodiments, some or all of the software is stored on memory, which includes one or more non-transitory computer readable media of one or more local or remote data storage devices. As used herein, "data storage device" means a device for non-transitory storage of code or data, e.g., a device with a non-transitory computer readable medium. As used herein, "non-transitory computer readable medium" mean any suitable non-transitory computer readable medium for storing code or data, such as a magnetic medium, e.g., fixed disks in external hard drives, fixed disks in internal hard drives, and flexible disks; an optical medium, e.g., CD disk, DVD disk, and other media, e.g., RAM, ROM, PROM, EPROM, EEPROM, flash PROM, external flash memory drives, etc. Communication circuits herein include antennas and/or data ports and driver chips for sending and receiving communications with other devices. In exemplary embodiment, communication circuits can include any one or more of Wi-Fi antennas and circuitry, LTE antennas and circuitry, GPS antennas and circuitry, CDPD antennas and circuitry, GPRS antennas and circuitry, GSM antennas and circuitry, UMTS antennas and circuitry, Ethernet circuitry, and other antennas and circuitry, USB ports and circuitry (e.g., standard, micro, mini, etc.), RS-232 ports and circuitry, proprietary ports and circuitry (e.g., APPLE 30-pin and Lightning ports), RFID antennas and circuitry, NFC antennas and circuitry, bump technology antennas and circuitry, a Bluetooth (e.g., BLE) antenna and circuitry, DOCSIS circuitry, ONT circuitry, and other antennas, ports, and circuitry.

As described herein, when one or more components are described as being connected, joined, affixed, coupled, attached, or otherwise interconnected, such interconnection may be direct as between the components or may be indirect such as through the use of one or more intermediary components. Also, as described herein, reference to a "member," "component," or "portion" shall not be limited to a single structural member, component, or element but can include an assembly of components, members or elements.

Thin film thermal mass flow sensor chips are a class of sensors developed for and are widely used to monitor the flow of air and gasses. However, these thin film thermal mass flow sensors have not been used in liquid applications.

It is understood that a fluid can be comprised of air, steam, gas, liquid or any combinations thereof. Herein, one or more of the disclosed embodiments of the present invention can be directed towards accurately measuring the low flow rate of a liquid by adapting the thin film thermal mass flow sensors to work in such a liquid environment.

Figure 4:
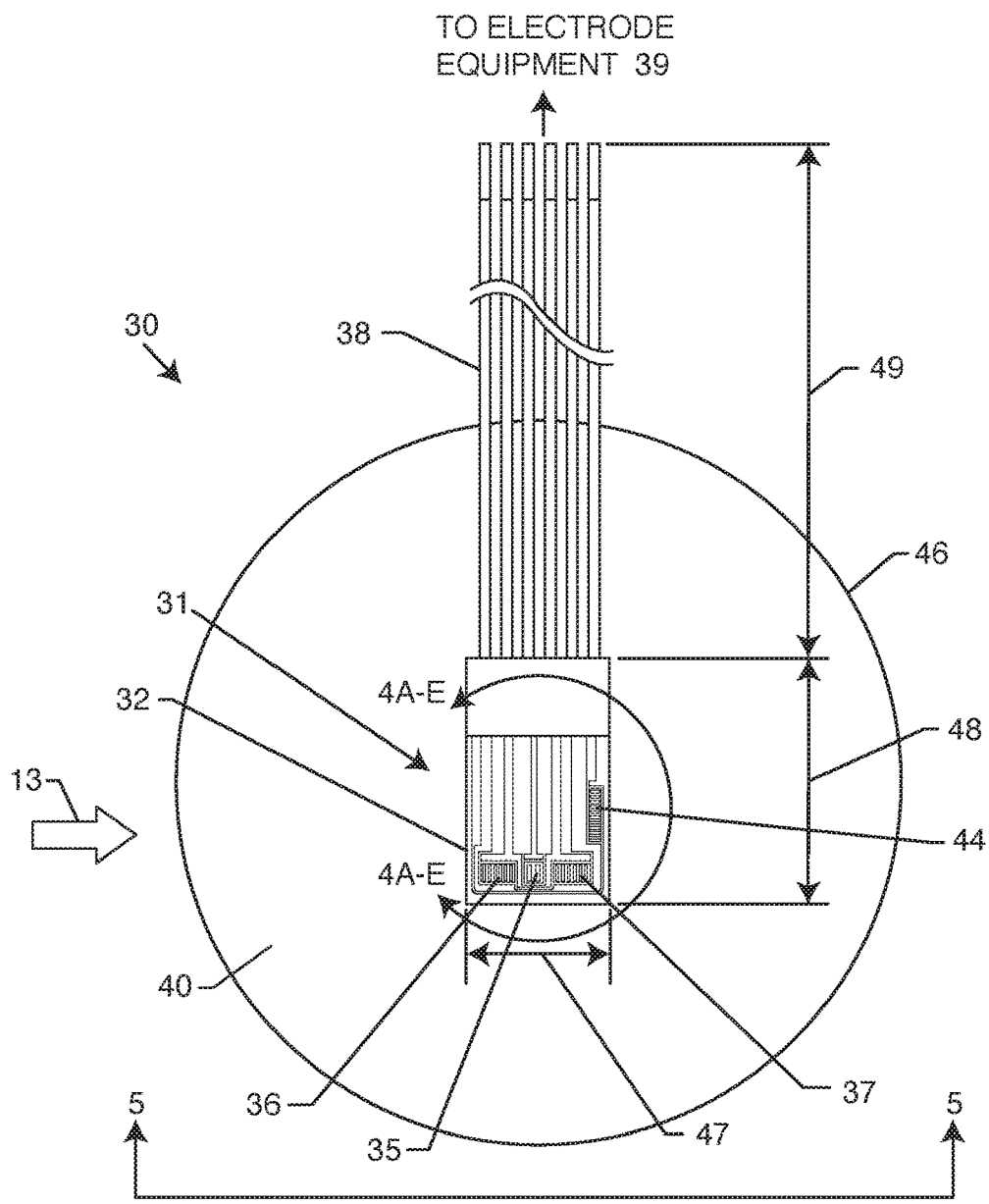
FIG. 4 is one exemplary embodiment of the present invention showing a thin film thermal mass flow sensor bonded to a thermally conductive membrane.
Figure 5:
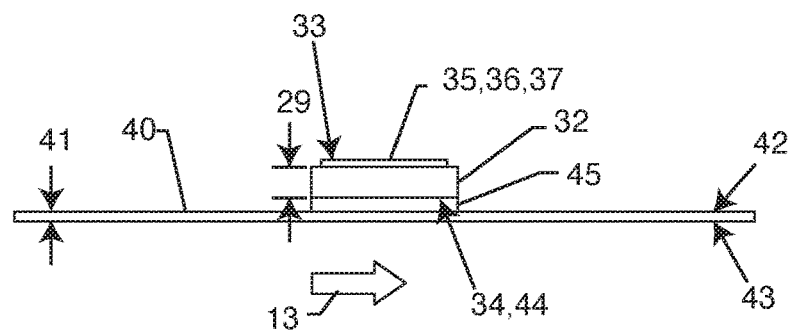
FIG. 5 is a side view of the structure of FIG. 4 taken along lines 5-5 from FIG. 4.

FIG. 4 is one exemplary embodiment of the present invention flow sensor 30 showing a thin film thermal mass flow sensor 31 bonded to a thermally conductive membrane 40 and FIG. 5 is a side view of the structure of FIG. 4. The flow sensor 30 is configured to detect a fluid flow 23 of a liquid 24 inside a pipe portion 22 as taught in FIG. 1, the fluid flow configured to move in a flow direction 13 along a longitudinal axis 25 of the pipe portion. Referring back to FIGS. 4 and 5, the flow sensor 30 comprises a thin film thermal mass flow sensor 31 having a substrate 32 defining a thickness 29 from an upper side 33 opposite a bottom side 34.

The upper side 33 of the substrate supports a resistor (heating element) circuit 35, a first temperature sensor circuit 36 and a second temperature sensor circuit 37. As can be seen in FIG. 4, the resistive heating circuit 35 is disposed between the first and second temperature sensor circuits 36 and 37.

Figure 4A:
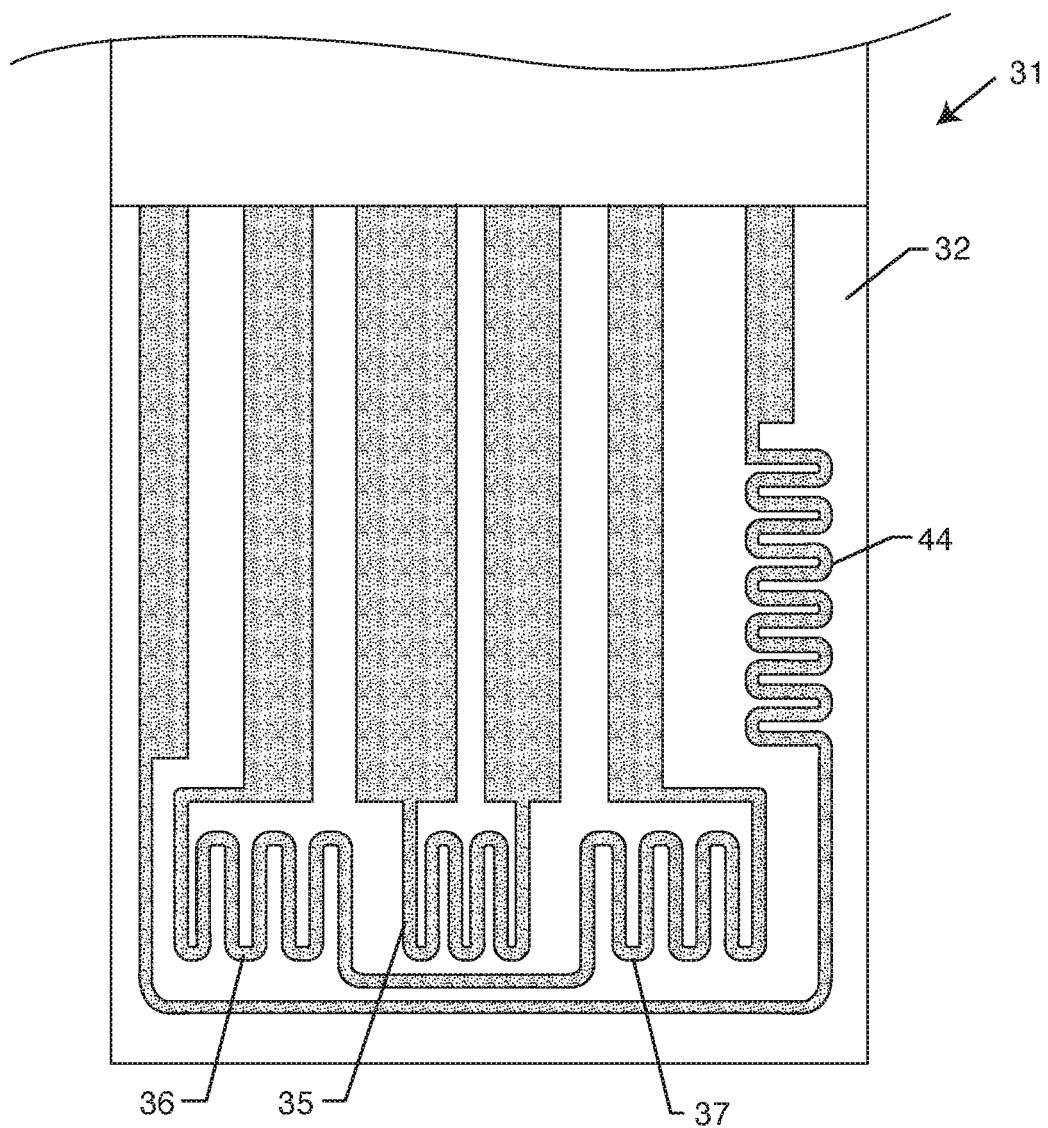
FIG. 4A is an enlarged view taken along lines 4A-4A from FIG. 4.

FIG. 4A is an enlarged view taken along lines 4A-4A from FIG. 4 where one can see better that the resistive heating circuit 35 is disposed between the first and second temperature sensor circuits 36 and 37. An optional ambient temperature sensor circuit 44 is also included in this embodiment, but it is understood that it could be removed. The first and second temperature sensor circuits 36 and 37 measure an unknown electrical resistance by balancing two legs of a bridge circuit, one leg of which includes the unknown component. One benefit of this configuration is its ability to provide accurate measurements.

Figure 4B:
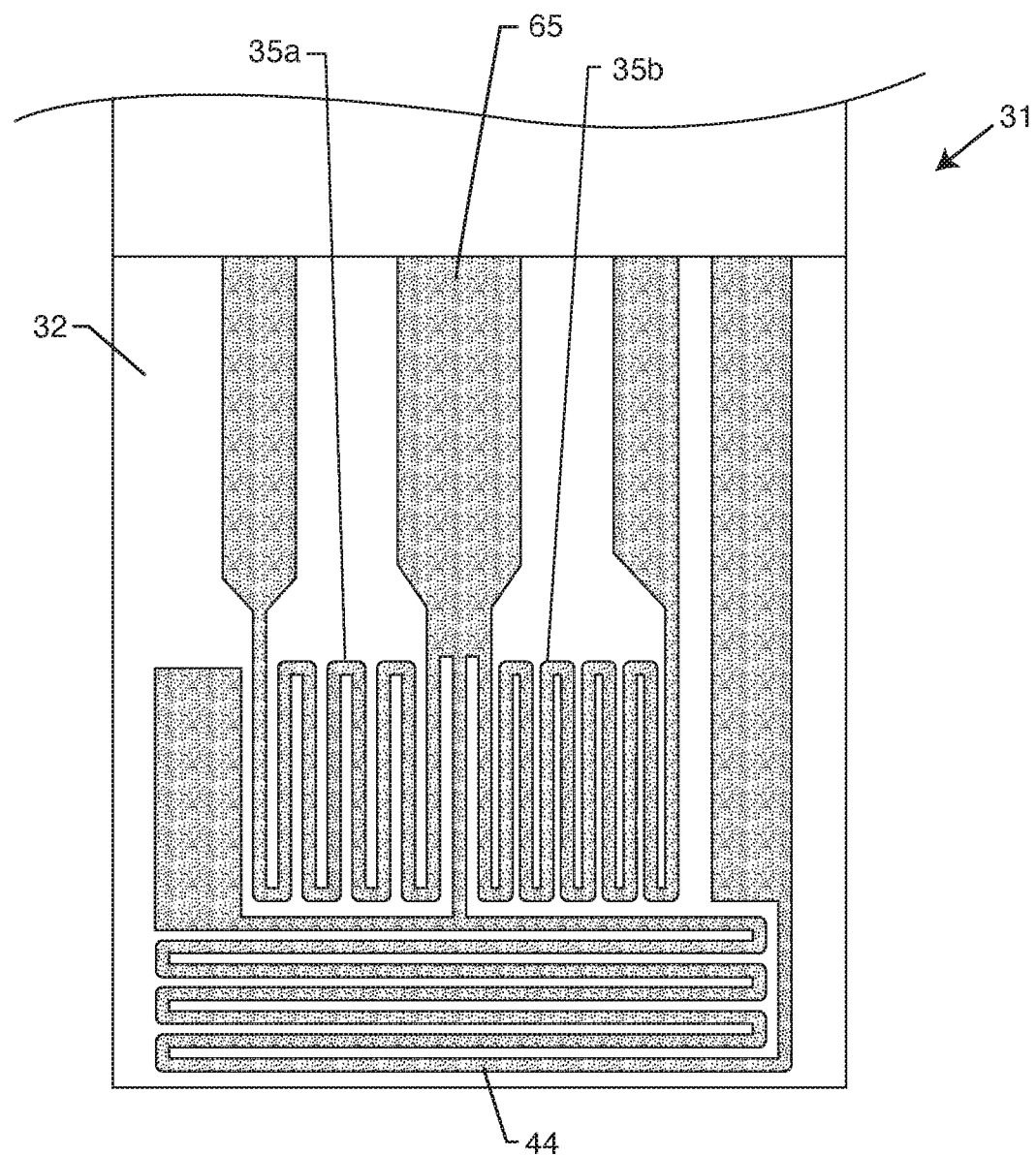
FIG. 4B is an enlarged view taken along lines 4B-4B from FIG. 4 now showing another embodiment of a thin film thermal mass flow sensor of the present invention.

FIG. 4B is an enlarged view taken along lines 4B-4B from FIG. 4 now showing another embodiment of a thin film thermal mass flow sensor 31 of the present invention. Here, there are two resistive heating circuits 35a and 35b. Additionally, there is an ambient temperature sensor 44 that is not in the fluid flow path of the heat generated by the two heating circuits 35a and 35b. The two resistive heating circuits 34a and 35b and the temperature sensor circuit 44 are all connected to a ground path 65.

Figure 4C:
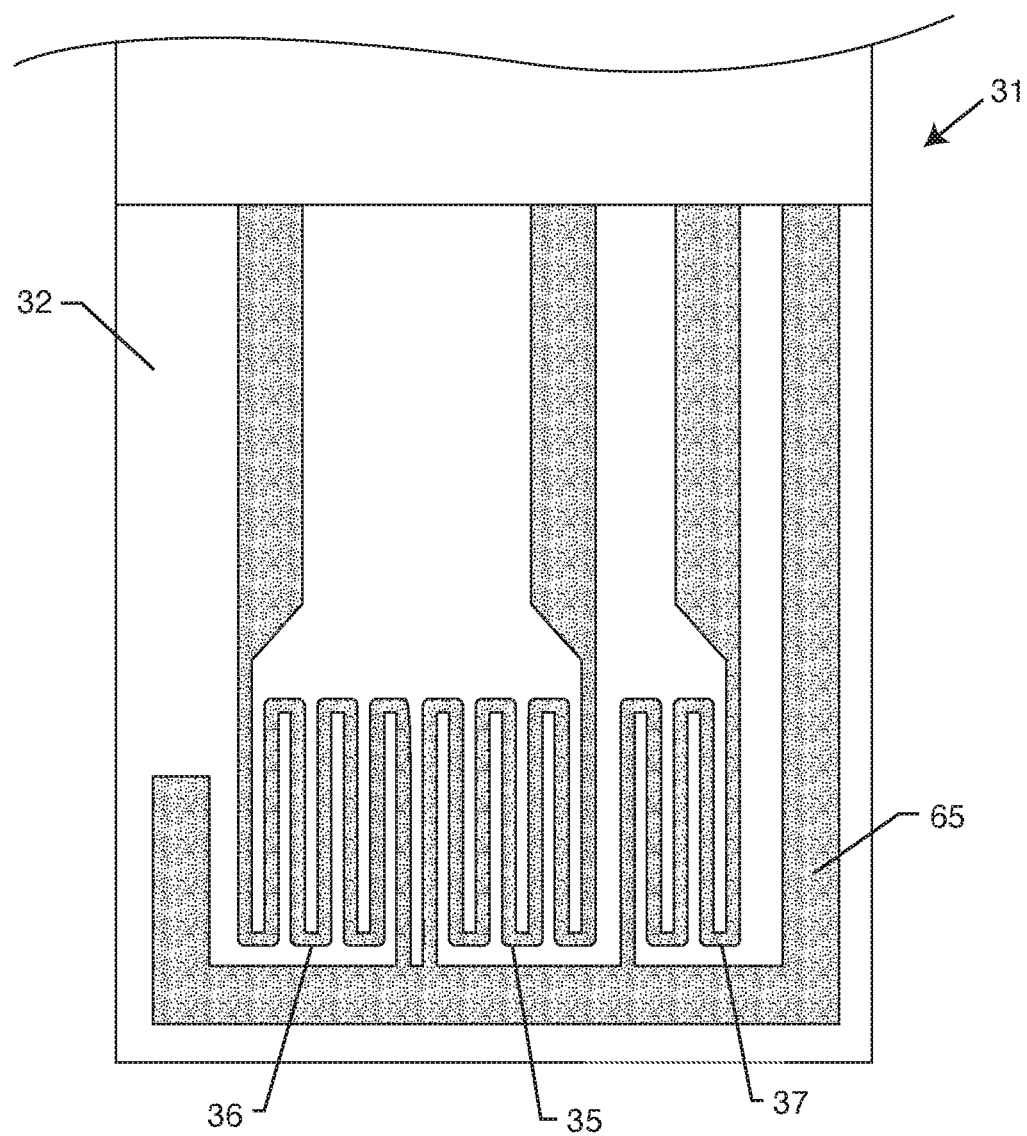
FIG. 4C is an enlarged view taken along lines 4C-4C from FIG. 4 now showing another embodiment of a thin film thermal mass flow sensor of the present invention.

FIG. 4C is an enlarged view taken along lines 4C-4C from FIG. 4 now showing another embodiment of a thin film thermal mass flow sensor 31 of the present invention. Here, there is once again a resistive heating circuit 35 disposed between a first temperature sensor circuit 36 and a second temperature sensor circuit 37. This embodiment does not include an additional ambient temperature sensor 44 as was taught in FIG. 4A. Referring again to FIG. 4C, one can see that all of the circuits 35, 36 and 37 are connected to a common ground 65.

Figure 4D:
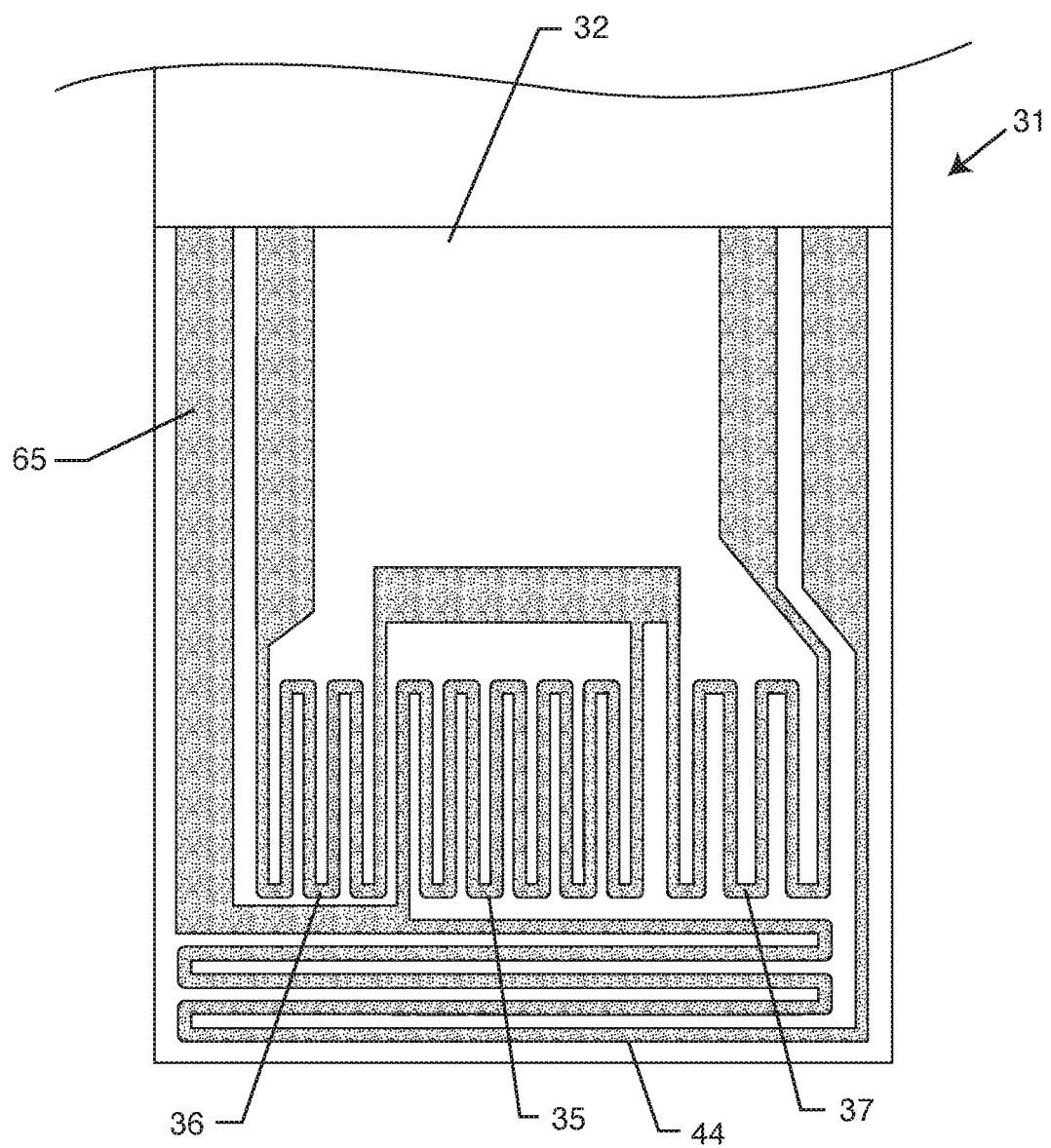
FIG. 4D is an enlarged view taken along lines 4D-4D from FIG. 4 now showing another embodiment of a thin film thermal mass flow sensor of the present invention.

FIG. 4D is an enlarged view taken along lines 4D-4D from FIG. 4 now showing another embodiment of a thin film thermal mass flow sensor 31 of the present invention. Here, the resistive heating circuit is disposed between a first temperature sensor circuit 36 and a second temperature sensor circuit 37. Additionally, there is an ambient temperature sensor 44 disposed at the bottom of the figure that is configured to not be heated from the fluid flow passing the resistive heating circuit 35. However, all of the circuits are connected to a common ground 65.

Figure 4E:
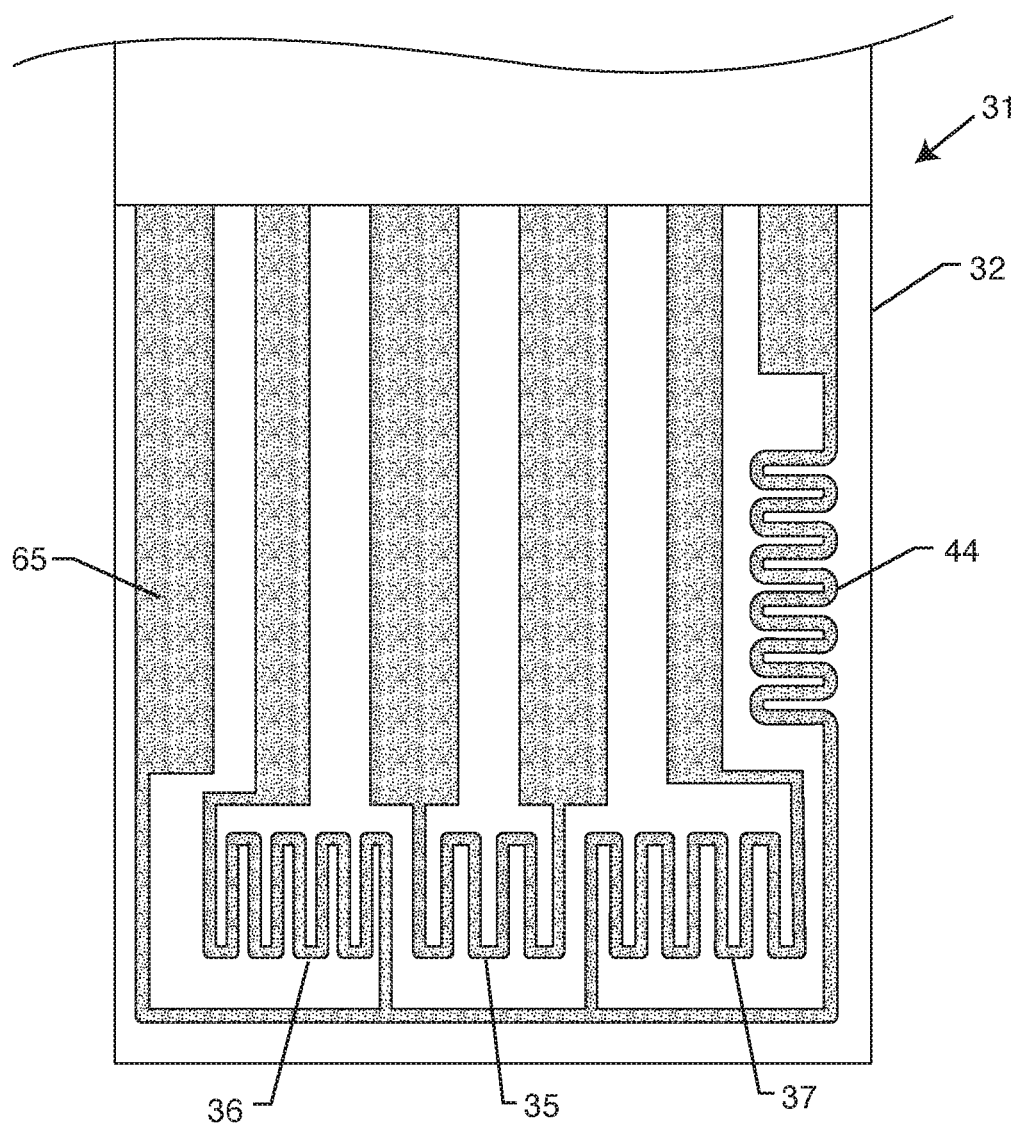
FIG. 4E is an enlarged view taken along lines 4E-4E from FIG. 4 now showing another embodiment of a thin film thermal mass flow sensor of the present invention.

FIG. 4E is an enlarged view taken along lines 4E-4E from FIG. 4 now showing another embodiment of a thin film thermal mass flow sensor 31 of the present invention. In this embodiment, there is once again a resistive heating circuit 35 disposed between a first temperature sensor circuit 36 and a second temperature sensor circuit 37. Also, there is an additional and optional ambient temperature sensor circuit 44 that is configured to not be in the fluid flow path of the heated fluid from the resistive heating circuit 35. Here, all of the circuits are connected to a common ground 65.

As can be seen and understood from the teachings of FIGS. 4A through 4D, there is an endless possibility of circuit configurations that are consistent with the teachings of this invention. Each embodiment would determine the temperature change and corresponding flow rate according to a custom algorithm that was specifically designed with each specific embodiment in mind. Accordingly, the present invention is not to be limited to the precise forms disclosed herein, as these embodiments show just some of the possible circuit configurations and embodiments that could be practiced in light of this teaching.

Each embodiment shown herein includes two or more temperature sensor circuits and at least one resistive heating sensor circuit. However, in other embodiments of the invention (not shown) the sensor 30 only includes one temperature sensor circuit and one resistive heating sensor circuit. Once again, each of the sensor designs would be matched with a custom algorithm with the specific circuit embodiment in mind.

Referring back to FIGS. 4A-E, it may be possible to power the resistive heating circuit at different intervals and then measure the ambient temperature through the temperature sensor circuits 36, 37 or 44. If such resistive heating circuits 35 remained powered for an extended period of time the portion of pipe surrounding the sensor 30 could also be heated and thereby interfere with any subsequent measurements. Therefore, it is preferred to power the resistive heating circuits 35 for different intervals and potentially prevent this from occurring.

It will be understood that these circuits 35, 36 and 37 are electrically connected respectively to a plurality of leadwires 38 configured to be attachable to electronic equipment 39

(not shown). The leadwires 38 can have a length 49 such as 250 mm, but any length is possible as is understandable by those skilled in the art. It is also understood by those skilled in the art that the leadwires 38 can be directly attachable to electronic equipment or include a wireless transmitter/receiver such that wireless communication is enabled from a substantial distance. For example, the information obtained from the present invention could be sent to the electronic equipment 39 over a wireless local intranet or through the Internet. Accordingly, information obtained from the present invention can be accessible over the intranet/Intranet from a mobile device or other like device to help monitor the plumbing system in general.

Figure 18:
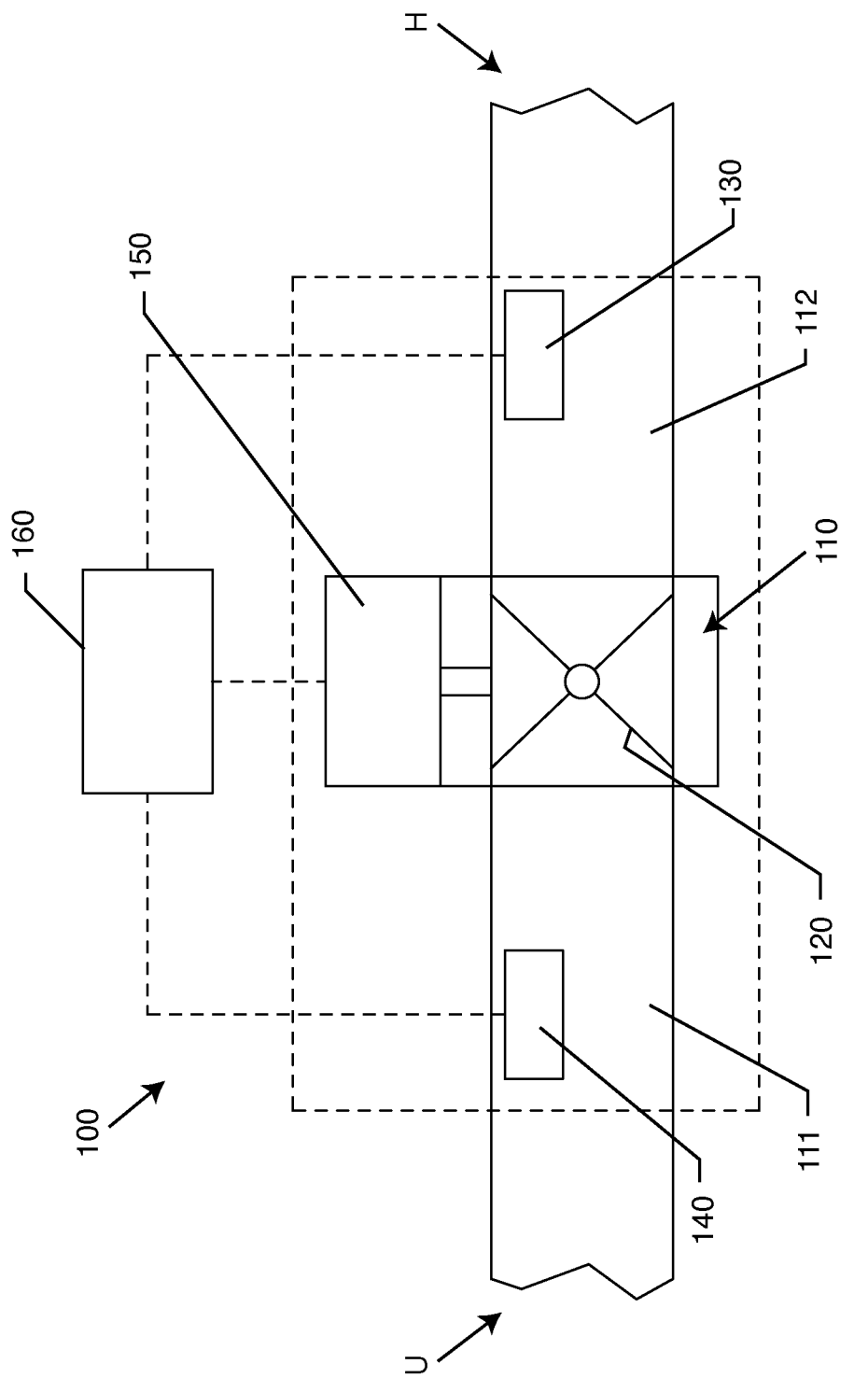
FIG. 18 schematically illustrates an exemplary monitoring and control system.

For example, FIG. 18 schematically illustrates an exemplary monitoring and control system 100 which also includes a control valve 110 having an inlet port 111 connected with a water source U (utility side) and an outlet port 112 connected with a local plumbing system H (home side), with a flow sensor 130 (e.g., any of the thin film thermal mass flow sensor assemblies 30 described herein), which may be integral to or assembled (directly or indirectly) with the valve 110. The flow sensor 130 may be disposed upstream of the valve element 120 (such as in position 140) or be disposed downstream of the valve element 120 as shown herein. Furthermore, the flow sensor 130 can include more than one, such that multiple flow sensors 130 are used at various locations along the control system 100.

The control valve 110 may include an electronically operated actuator 150 operable to open, close, or otherwise regulate a valve element 120 within the valve. This may be performed, for example, in response to indications from the sensors 130, 140 or a command from the user input module 170 (FIG. 19).

A control module 160 is operatively connected (e.g., by wired or wireless electronic communication) with the flow sensor 130 to receive and process fluid flow data, and with the actuator 150 to provide actuating signals for operation of the actuator to adjust the valve element 120 to a selected flow position, between closed and fully open, for example, in response to user input or in response to sensed fluid flow data from the flow sensor 130. In addition to the flow sensor 130, the system 100 may include other sensors 140 such as, for example, pressure sensors, temperature sensors, vibration sensors, and moisture sensors. Sensors 140 may be separately disposed from sensor 130 either on the same side or opposite side of the valve element, or sensors 140 may be integrally formed as part of and/or disposed with sensor 130.

Although a control valve 110 and associated components (e.g., valve element 120, control module 160) are shown herein, those of skill in the art will recognize that in yet other embodiments there may not be a control valve 110 and associated components; instead, the flow sensor 130 (e.g., any of the thin film thermal mass flow sensor assemblies 30 described herein) may be operably connected to a transceiver (not shown) for communication with other devices such as, for example, a user input module 170, as described herein. In these other embodiments, the thermal flow sensor 30 can be positioned at the main water inlet or anywhere in the water system, as shown in FIG. 18, or may be positioned at closer to a point of use such as near the inlet of a plumbing fixture, for example, a toilet, a sink, a tub or a faucet and the like. Further, one or more thermal flow sensors 130 (30) and fluid sensors 140 may be used in conjunction with one another in a system to determine water usage and leaks within the system.

Figure 19:
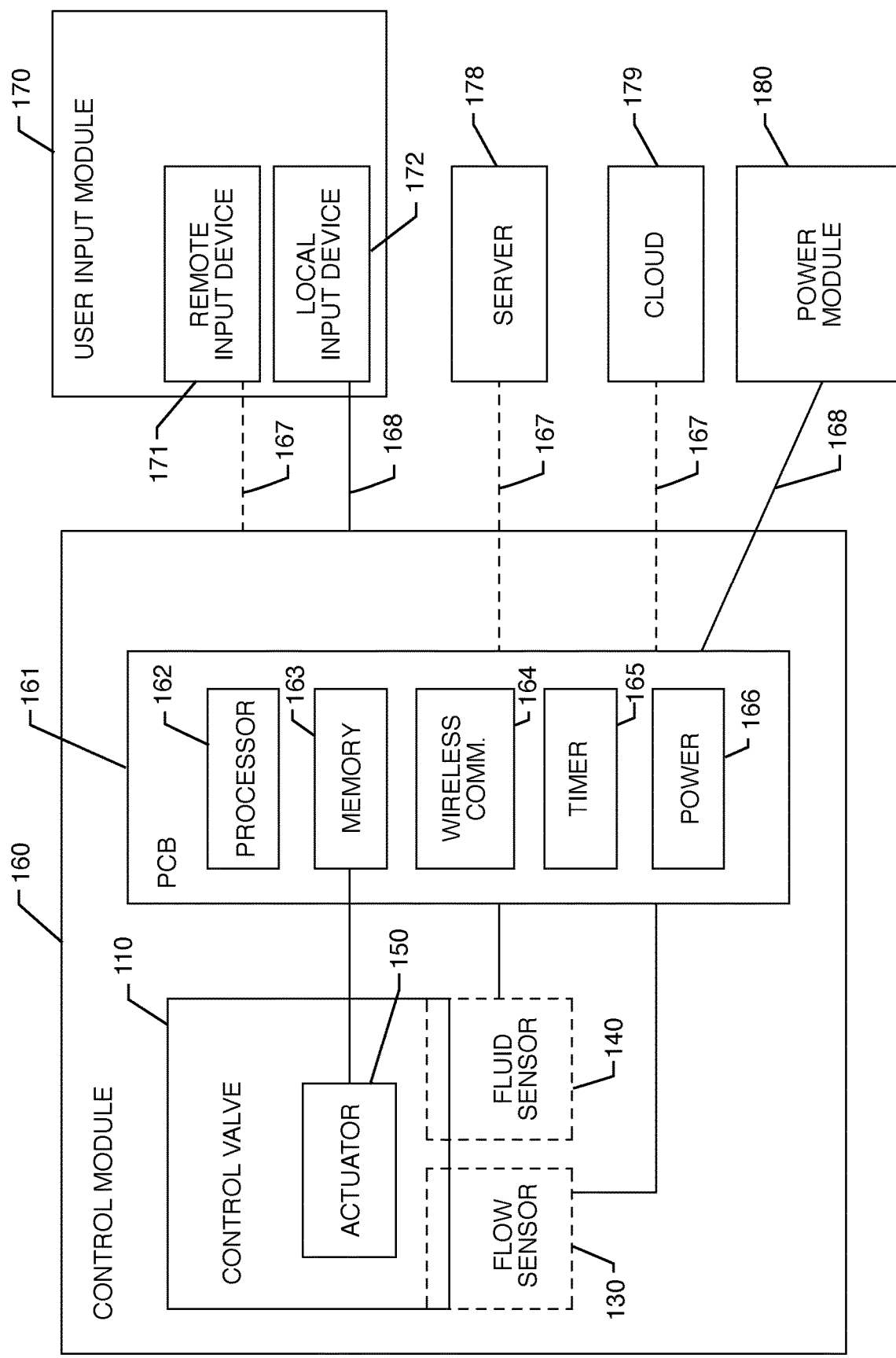
FIG. 19 schematically illustrates a controller of the present invention, which may include a number of electronic components.

In an exemplary embodiment, as schematically shown in FIG. 19, the controller 160 may include a number of electronic components. These components enable the operation of the control valve 110 and the monitoring of the local fluid system. More specifically, these components enable the activation, deactivation, and control of the valve 110. The controller 160 may be integrated with the control valve 110, assembled with the control valve, or remotely connected with the control valve (e.g., using wired or wireless communication). The controller 160 may include one or more printed circuit boards ("PCBs") 161. In the illustrated example, a number of electronic components are mounted on the PCB 161, including, but not limited to, a processor 162, memory 163, a wireless communication chip 164, a timer 165, and a power port 166. The processor 162 receives signals from and sends signals to the electronically operated actuator 150 to control operation of the valve 110. For example, the processor 162 receives signals from the flow sensor 130 (described in greater detail above) and any other fluid sensors 140 and sends signals to the electronically operated actuator 150 to activate, deactivate, and control the valve 110. The timer 166 measures time intervals and instances for these actions, for example, for storage or communication with corresponding measured parameters (e.g., flow rate, pressure, temperature, etc.) or other actions.

The memory 163 can save information received from the sensors 130, 140 and the actuator 150. The information can also be saved in remote memory. Exemplary storage locations for the remote memory include a user input module 170 (e.g., a smartphone, tablet, or computer), a centralized server provided by the valve/control module manufacturer or other service provider, and/or a cloud service provided by the valve/control module manufacturer or a third party provider (such as Google®, HomeKit®, and IFTTT®). In the illustrated example, examples of the remote memory includes a server 178 and a cloud computing network 179. This fluid data information may be presented to a user in a variety of formats and using a variety of platforms (e.g., text message, software or web-based application) to present information regarding fluid usage, potential leaks, and other fluid system conditions.

In the illustrated example, the user input module 170 may provide operational instructions to the control module 160. The user input module 170 can be any module that enables user input. The user input module 170 may include one or more remote input device(s) 171 and manual input device(s) 172. Exemplary electronic input devices 171 include activation sensors, mobile devices, voice controlled devices, and touch screen devices, such as, for example, a smart phone, smart speaker, computer, or tablet. Exemplary manual input devices 172 include buttons, touchpads, and toggle switches connected with the valve 110 and/or control module 160. The user input module 170 receives input from a user and sends signals to the control module 160 to control operation of the valve 110. For example, the user input module 170 receives input from a user and sends signals to the processor 162 to activate, deactivate, and control the valve 110. In the illustrated embodiments, some components of the user input module 170 (e.g., a mobile device or voice controlled device) are connected to the control module 160 via a wireless communication connection 167 (such as a Wi-Fi connection with wireless communication chip 164) for wireless signal transmission, while other components of the user input module 170 (e.g., the local input device) are connected to the control module 160 via a hard-wired connection 168 for wired signal transmission. In other arrangements, each component of the user input module 170 could be connected to the control module 160 and send signals to and/or receive signals from the processor 162 via any type of connection, including other wireless communication connections, such as Bluetooth, cellular, near field communication (NFC), Zigbee, and Z-Wave, or a hard-wired connection. The user input module 170 could include any number of components. Moreover, each component of the user input module 170 could be in any location where it can send signals to and/or receive signals from the control module 160 and/or other electronic components of the proportional control valve 110, such as the processor 162, or each component of the user input module 170 could be integrally formed with or physically connected to the valve 110 and/or control module 160. Alternately, in cases where there is no control module 160, signals may be sent and received between a transceiver (not shown) operably connected to one or more sensors 140, 130.

In the illustrated embodiment, a power module 180 provides power to the electrical/electronic components of the control module 160. In the illustrated embodiment, the power module 180 is connected to the power port 166 of the control module 60 via a hard-wired connection 168. The power module 180 may include a variety of power sources, including, for example, AC power, battery power, or AC power with a battery backup.

During user operation of the electronic valve 110, the user may activate, deactivate, and/or control the electronic valve 110 using one or more components of the user input module 170. For example, the user could operate the user input module 170 by triggering an activation sensor/switch 173 on the valve 110 or control module 160, pressing an appropriate button or touchscreen prompt on the mobile device 174, and/or vocalizing specific commands (e.g., device programmed voice prompts, such as "turn on" and "turn off") to the voice controlled device 175.

Referring now back to FIGS. 4 and 5 showing exemplary embodiments of the thermal fluid flow sensor 30, the resistive heating circuit may be advantageously oriented in relation to the direction of the fluid flow 13 as shown. In these preferred embodiments, the fluid flow passes from the first temperature sensor circuit, to the resistive heating circuit and then to the second temperature sensor circuit. This orientation allows the heat concentration to be imparted to the fluid such that the two temperature sensors will register a differential under the slowest of fluid flows. If the fluid flow was stagnant, the two temperature sensors would register no differential. Then, under the slightest of flow rates, the temperature sensor downstream of the resistive heating circuit will register a higher temperature thereby indicating a flow rate. It is also understood that the thin film thermal mass flow sensor could work in the opposite direction, as the first and second temperatures can easily switch their functionality to register a flow rate. Also, depending on the differential between temperatures sensor, a direction of the flow rate can also be determined. For example, the flow rate value and the flow rate direction can be identified based on the relative first and second temperature readings.

In one embodiment, a thermally conductive membrane 40 is configured to separate the fluid flow of the liquid inside the pipe portion from the thin film thermal mass flow sensor 31. In this embodiment, a thermally conductive bond 45 connects the bottom side of the thin film thermal mass flow sensor to the thermally conductive membrane. The liquid is able to flow adjacent one side of the thermally conductive membrane while never coming into direct contact with the circuits 35, 36, and 37 and preventing an electrical short. However, thermal energy is still able to be transferred such that the thin film thermal mass flow sensor can function as intended.

In this embodiment, the thickness of the substrate is thin and is thermally conductive while electrically insulative. For example, the substrate 45 can be approximately 0.1 mm in thickness or less. In exemplary embodiments, the substrate material can comprise a ceramic substrate or a glass substrate. Additionally, the circuits formed on top of the substrate can be platinum formed in a printed and/or silk screened process. Also, a glass passivation may be applied on top of the circuits to protect the platinum structure.

Furthermore, in this embodiment the thickness 41 of the thermally conductive membrane may be thin. For example, the thermally conductive substrate can be 0.25 mm as shown here. Other embodiments may include different thicknesses, for example, including equal to or less than 0.5 mm in one embodiment; equal to or less than 0.25 mm in another embodiment; equal to or less than 0.15 mm in another embodiment; equal to or less than 0.10 mm in another embodiment; and equal to or less than 0.05 mm in yet another embodiment. In this embodiment, the thermally conductive membrane can be formed from a metal, such as a stainless steel (302/304). Other metallic materials can be used, such as cooper, brass, aluminum or other composite materials. As shown herein, the thermally conductive membrane is formed as a disk, however other shapes are possible such as squares, rectangles, hexagons and the like as these embodiments taught herein are not to be limited to just circles.

The inventors of the application have discovered that it is difficult to solder the substrate 32 to the stainless steel of the thermally conductive membrane 40 without a particular flux liquid. In preferred embodiments, flux is avoided because it may pollute the environment and water supply, but it can be used in less preferred embodiments. In a preferred embodiment, the lower side of the substrate is metallized with a metal vapor deposition 44. These metal vapor depositions may include ferrous and nonferrous metal composites. In a most preferred embodiment, the thermally conductive bond 45 can comprise a gold plating that forms an improved connection between the substrate and the thermally conductive membrane 40. In a preferred embodiment, the gold comprises a thin layer to reduce costs and is located at the lower side of the substrate.

It is noted by the inventors, that other less preferred metals beyond stainless steel can be used for the thermally conductive membrane. In these less preferred embodiments, many of the other metals have a higher thermal conductivity in comparison to stainless steel which, contrary to expectations, is less desirable. The reason is that too high of a thermal conductivity can defuse the concentration of heat generated by the resistive heating circuit 35 faster than desired and, in the less preferred embodiments, cause functioning of the thin film thermal mass flow sensor 31 in a less desirable manner.

For example, stainless steel at around 68° F. (roughly room temperature) generally has a thermal conductivity of 14.3-14.4 W/mK (Watts per meter-Kelvin; also rated in Btu/(ft h ° F.)). More specifically, stainless steel type 304 has a thermal conductivity of 14.4 W/mK and stainless steel type 347 has a thermal conductivity of 14.3 W/mK. It is noted that thermal conductivity does generally vary a small amount in metals depending upon the current temperature of that metal.

Furthermore, aluminum generally has a thermal conductivity of about 240 W/mK at room temperature. Copper generally has a thermal conductivity of about 400 W/mK. These metals may be formed as an alloy to bring their thermal conductivity down to be in the range of the preferred embodiments of the present invention. For example, copper constantan is generally 60% copper and 40% nickel and has a thermal conductivity of about 23 W/mk. As can be understood by those skilled in the art, other metals may work in the present invention when their thermal conductivities are brought in line with the teaching of this disclosure. For example, Inconel has a thermal conductivity of about 15 W/mK and titanium has a thermal conductivity of about 22. Different embodiments of the present invention may employ thermally conductive membranes having a thermal conductivity of around 14.3-14.4 plus or minus 10%; in other embodiments the thermal conductivity may vary by 25% from the 14.3-14.4 range; and, in yet other embodiments it may vary by 50% from the 14.3-14.4 range. For example, the thermal conductivity of the thermally conductive membranes, in certain embodiments, are within a range equal to or between 10-20 W/mk; in other embodiments, between 5-30 W/mk; and, in yet other embodiments between 2.5-50 W/mK; further, in yet other embodiments, the range might be equal to or less than 50 W/mk; or equal to or less than 30 W/mK in some embodiments; and, in yet different embodiments be equal to or less than 20 W/mK.

In a most preferred method, gold plating operation is preferably performed with a vacuum soldering operation to avoid air pockets under the solder surface. In less preferred embodiments, the air pockets can compromise the heat transfer pattern which can negatively affect signal repeatability and consistency in large scale production.

In FIG. 4, the width 47 of the substrate is about 3.5 mm and the length 48 is about 5 mm. It is understood that this is just one embodiment and that other sizes are possible in light of this teaching. Furthermore, the diameter 46 of the thermally conductive membrane is about 19 mm. However, again it is understood that this is just one embodiment and that other sizes (smaller or larger) are possible in light of this teaching.

Figure 6:
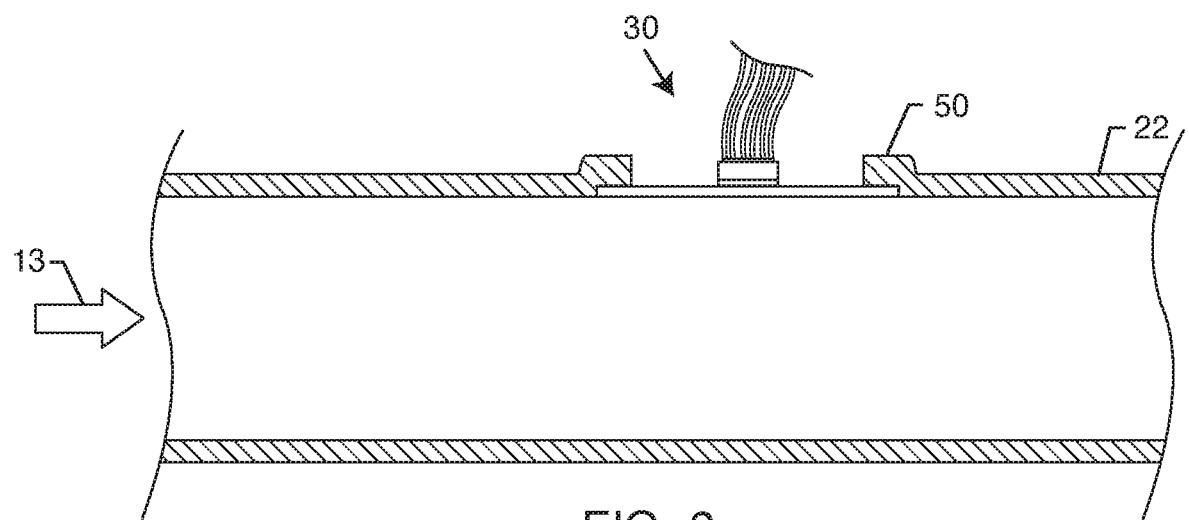
FIG. 6 is a sectional side view illustrating one embodiment of the structure of FIGS. 4 and 5 now mounted in a pipe portion.

FIG. 6 is a sectional side view illustrating one embodiment of the structure of FIGS. 4 and 5 now mounted in a pipe portion 22. In this embodiment, the sensor 30 has been mounted in a sensor housing 50 that is integrally formed as part of the pipe portion. In this embodiment the thermally conductive membrane aligns with the inner surface 26. The flow rate at this location would be lower than in the center as shown in FIG. 1, and therefore, while still functional and an embodiment of this invention, it is not an optimal placement of the sensor 30.

Figure 7:
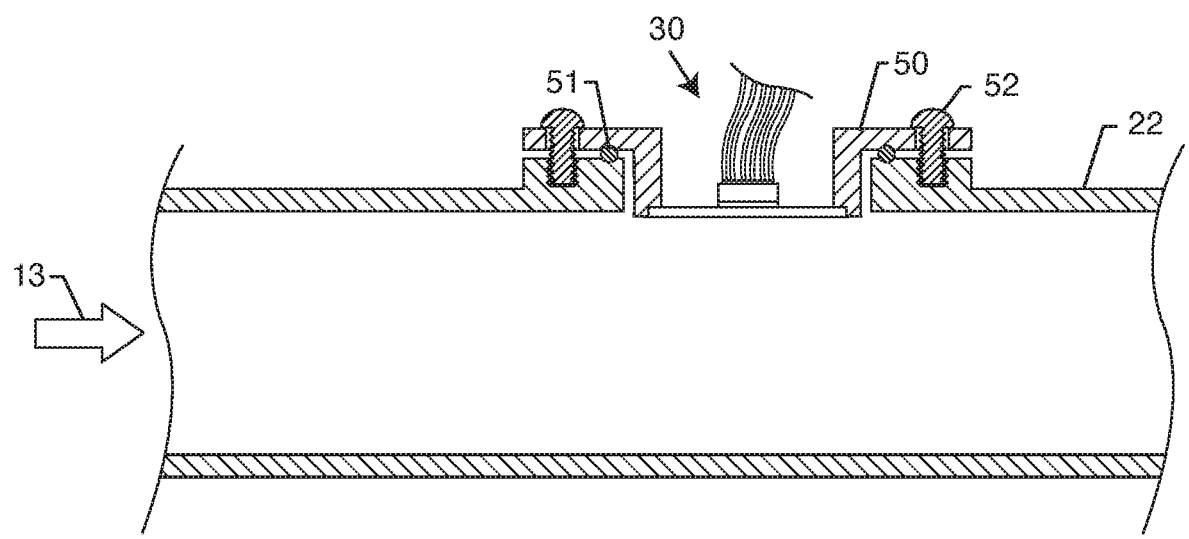
FIG. 7 is a sectional side view illustrating another embodiment of the structure of FIGS. 4 and 5 now mounted in a pipe portion.

FIG. 7 is a sectional side view illustrating another embodiment of the structure of FIGS. 4 and 5 now mounted in a pipe portion. In this embodiment the sensor housing 50 is formed as a separate part that would capture the sensor 30. The sensor housing 50 could include a seal 51 to prevent the fluid from leaking. Fasteners 52 could be used to secure the sensor housing 50 in place.

Figure 8:
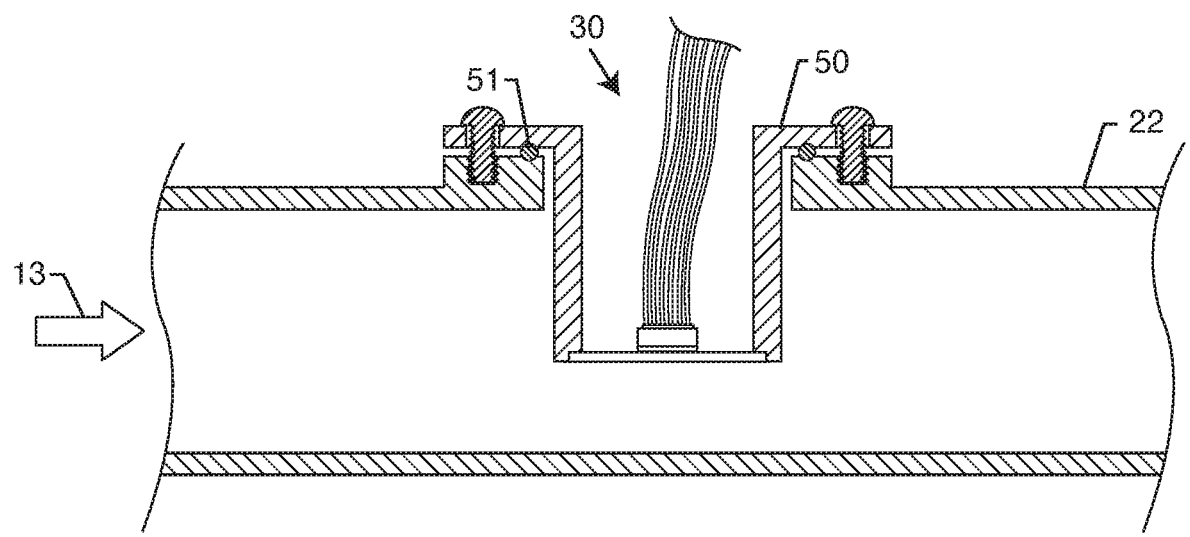
FIG. 8 is a sectional side view illustrating another embodiment of the structure of FIGS. 4 and 5 now mounted in a pipe portion.

FIG. 8 is a sectional side view illustrating another embodiment of the structure of FIGS. 4 and 5 now mounted in a pipe portion. FIG. 8 is very similar to FIG. 7, except in FIG. 8 the sensor housing 50 is formed elongated such that the sensor 30 is positioned closer to the center of the pipe such that it can register a stronger liquid flow.

Figure 9:
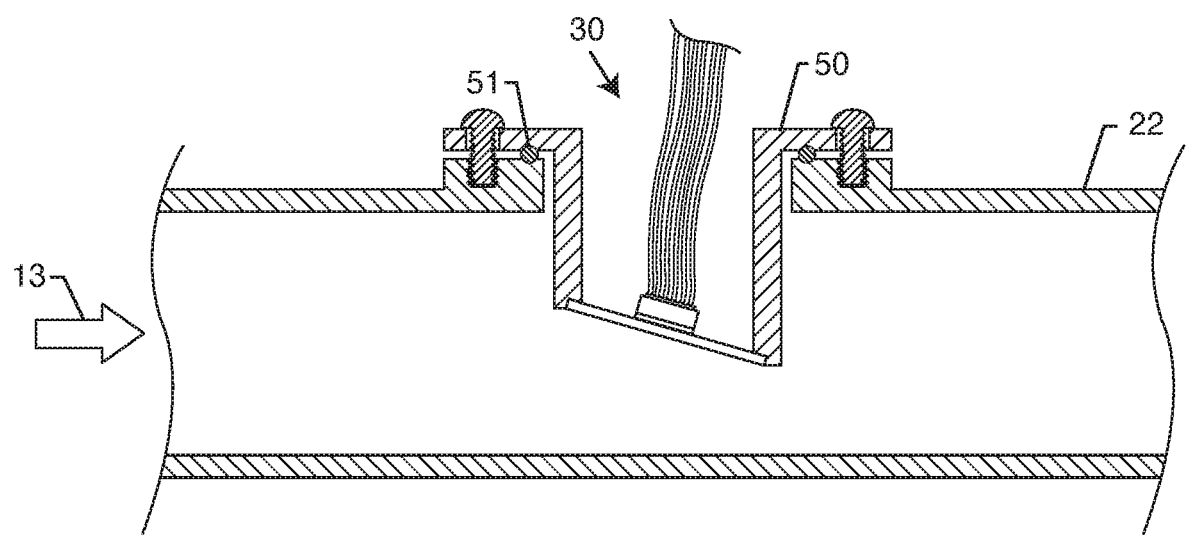
FIG. 9 is a sectional side view illustrating another embodiment of the structure of FIGS. 4 and 5 now mounted in a pipe portion.

FIG. 9 is a sectional side view illustrating another embodiment of the structure of FIGS. 4 and 5 now mounted in a pipe portion. FIG. 9 is very similar to FIG. 8 except FIG. 9 shows the sensor 30 is captured at an angle to force a more direct flow over the thermally conductive membrane.

Figure 3:
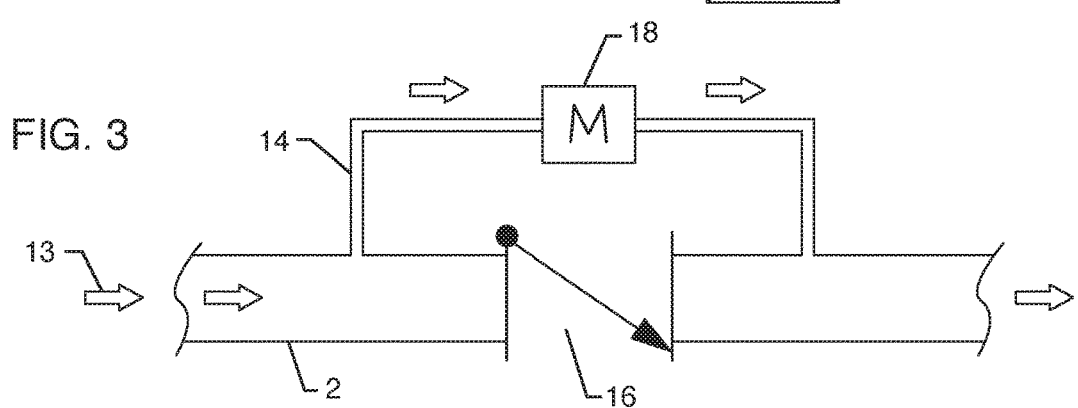
FIG. 3 is a simplified plumbing schematic of a pipe portion having check valve with a bypass loop and flow meter.
Figure 10:
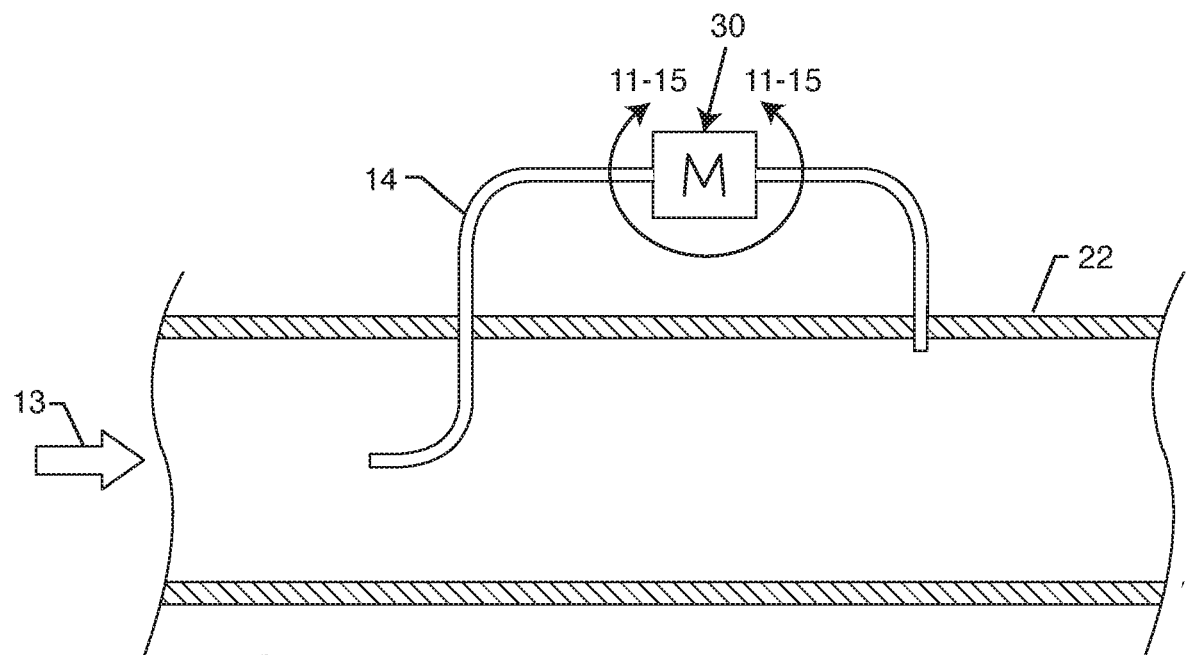
FIG. 10 is a sectional side view illustrating a bypass line in parallel to a pipe portion.

FIG. 10 is a sectional side view illustrating a bypass loop (i.e. bypass line) 14 in parallel to a pipe portion 22. This embodiment is very similar to FIG. 3 except FIG. 10 shows the check valve 16 has been removed. Furthermore, the flow sensor 30 can now include another novel embodiment taught herein.

Figure 10A:
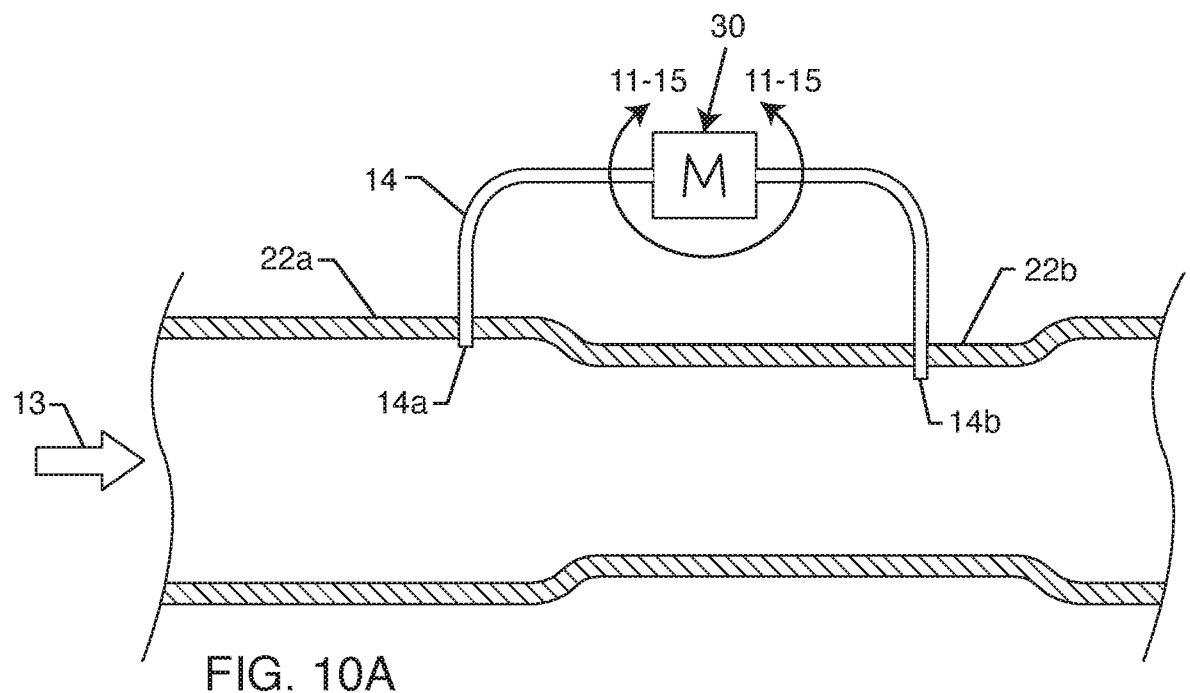
FIG. 10A is a sectional side view illustrating another embodiment of a bypass line in parallel to a pipe portion.

FIG. 10A is a sectional side view illustrating a bypass loop 14 in parallel to a pipe portion 22 similar to FIG. 10. However, in this embodiment the inlet side of the bypass loop 14 does not extend inside the pipe to capture the center of the fluid flow as shown in FIG. 10. Rather, in this embodiment, the pipe portion has a first pipe portion 22a that is larger in diameter (i.e. larger cross-sectional area) in comparison to the diameter of pipe portion 22b. The difference in pipe diameters allow the flow rate through pipe portion 22b to be slightly increased, which causes a pressure differential between bypass inlet 14a and bypass outlet 14b due to the venturi effect, which is well understood by those skilled in the art and need not be discussed further. The venturi effect then causes a fluid flow through the bypass loop 14 such that the flow sensor 30 can now detect the flow rate.

Figure 11:
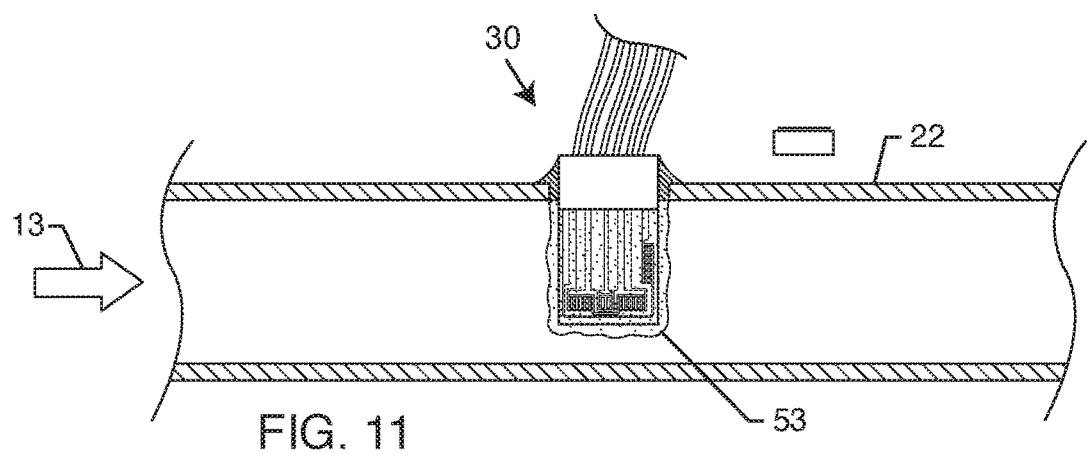
FIG. 11 is a sectional side view taken generally from lines 11-11 from FIGS. 10-10A now showing a new embodiment of the present invention.

FIGS. 11-15 are a sectional side views taken generally from lines 11-11 to 15-15 from FIG. 10 or FIG. 10A now showing new alternative embodiments of the present invention. FIG. 11 shows a similar thin film thermal mass flow sensor 31 as previously taught, but now it is covered in a conformal coating 53. The conformal coating 53 is electrically insulative and thermally conductive. In these new alternative embodiments, the sensor portion 31 can be directly inserted into the fluid flow and not be harmed by the liquid moving past.

The conformal coating 53 can comprise a range of materials known to those skilled in the art. In one embodiment the conformal coating can comprise a polymer dip or a glass dip. In another embodiment, the conformal coating can be applied in a vapor deposition process or a spraying process. In another embodiment the conformal coating can include carbon nanotubes. As an example, the conformal coating 53 can comprise a polymer over-mold with carbon nanotubes which may increase longevity while reducing the thickness for improved sensitivity. In another embodiment, the material of the conformal coating can include the same thermal conductivity ranges as previously taught for the thermally conductive membrane 46.

Figure 12:
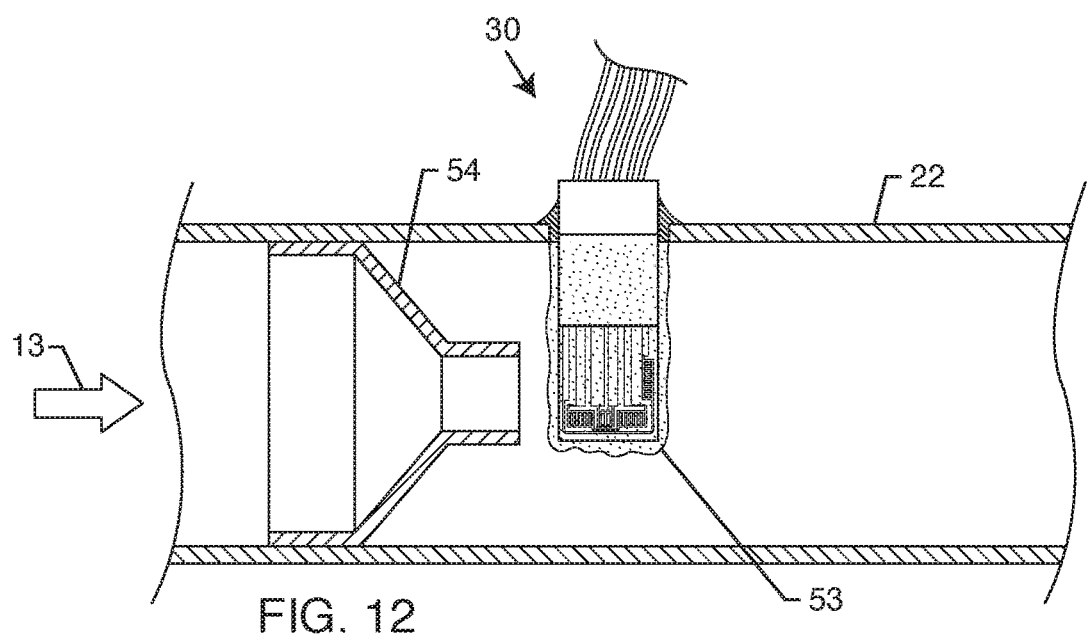
FIG. 12 is a sectional side view taken generally from lines 12-12 from FIGS. 10-10A now showing a new embodiment of the present invention.

FIG. 12 is similar to FIG. 11, but one will notice that the pipe portion is larger. Therefore, a small flow rate will be harder to detect. Accordingly, in FIG. 12, a funnel structure 12 is used to accelerate the flow at the location of the sensor 30 such that the sensor can more easily detect the low flow rate.

Figure 13:
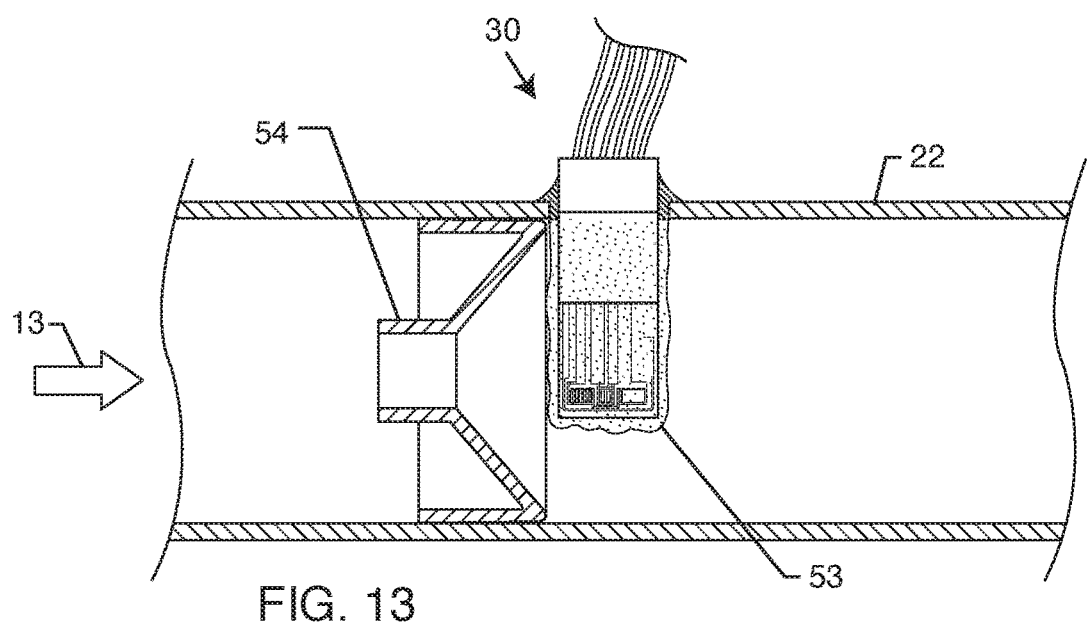
FIG. 13 is a sectional side view taken generally from lines 13-13 from FIGS. 10-10A now showing a new embodiment of the present invention.

FIG. 13 is very similar to FIG. 12, except the funnel 54 of FIG. 13 has a different shape. The funnels 54 can be temporarily inserted into the pipe portion 22 with an interference fit or may be welded or fastened to the pipe portion for a more permanent attachment.

It is also understood herein that the funnel 54 could also be applied the previous embodiments taught in FIGS. 6-9 such that the funnel structure would accelerate a flow rate over the thermally conductive member 40 to increase the accuracy and sensitivity of the sensor 30.

Figure 14:
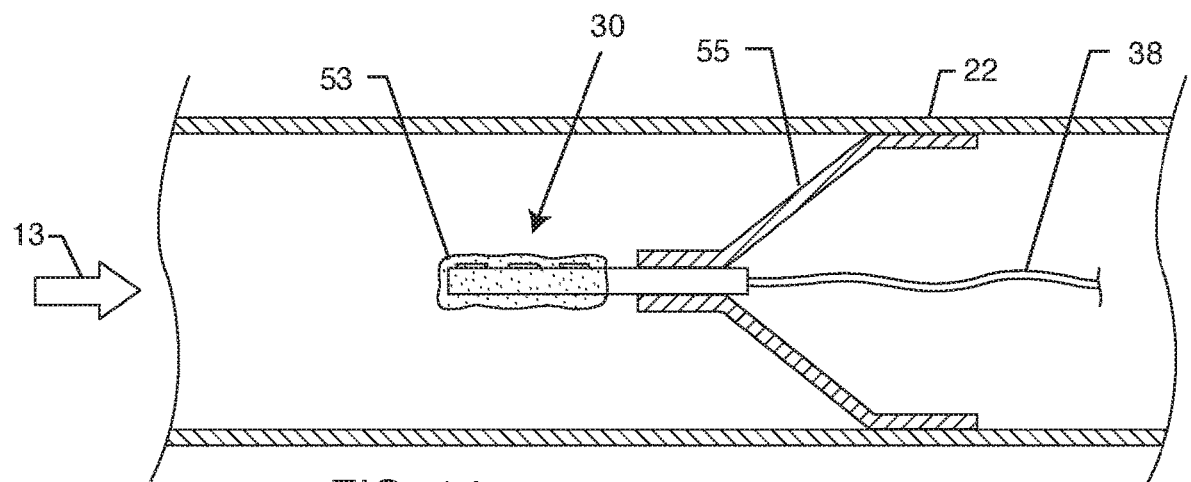
FIG. 14 is a sectional side view taken generally from lines 14-14 from FIGS. 10-10A now showing a new embodiment of the present invention.

FIG. 14 is another embodiment of a support structure 55 that supports the sensor 30 in the center of the fluid flow. The support structure 55 locates the sensor ahead of the support structure such that an undisturbed flow reaches the sensor 30 first minimizing turbulence and interference. The leadwires 38 would similarly be routed to distal electronic equipment further downstream as previously taught, which may include hard wired connections and various wireless connection structures.

Figure 15:
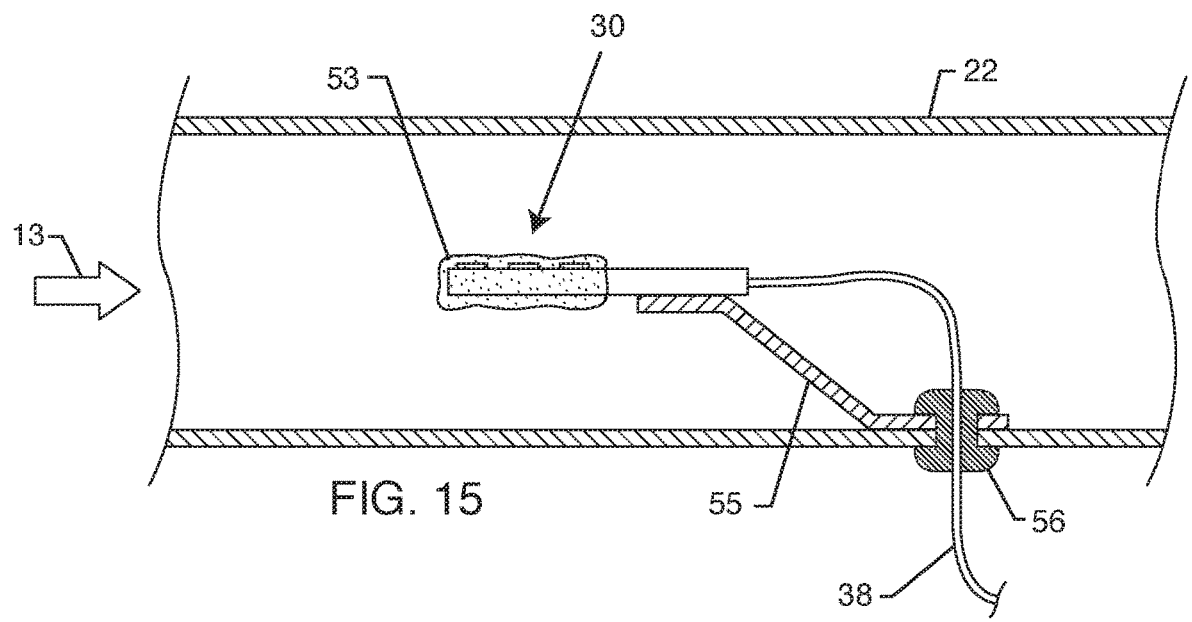
FIG. 15 is a sectional side view taken generally from lines 15-15 from FIGS. 10-10A now showing a new embodiment of the present invention.

FIG. 15 is another embodiment of a support structure 55 that supports the sensor 30 in the center of the fluid flow. Here, the leadwires 38 are taken out of the pipe portion 22 through a sealed hole that has a seal/grommet 56.

Figure 16:
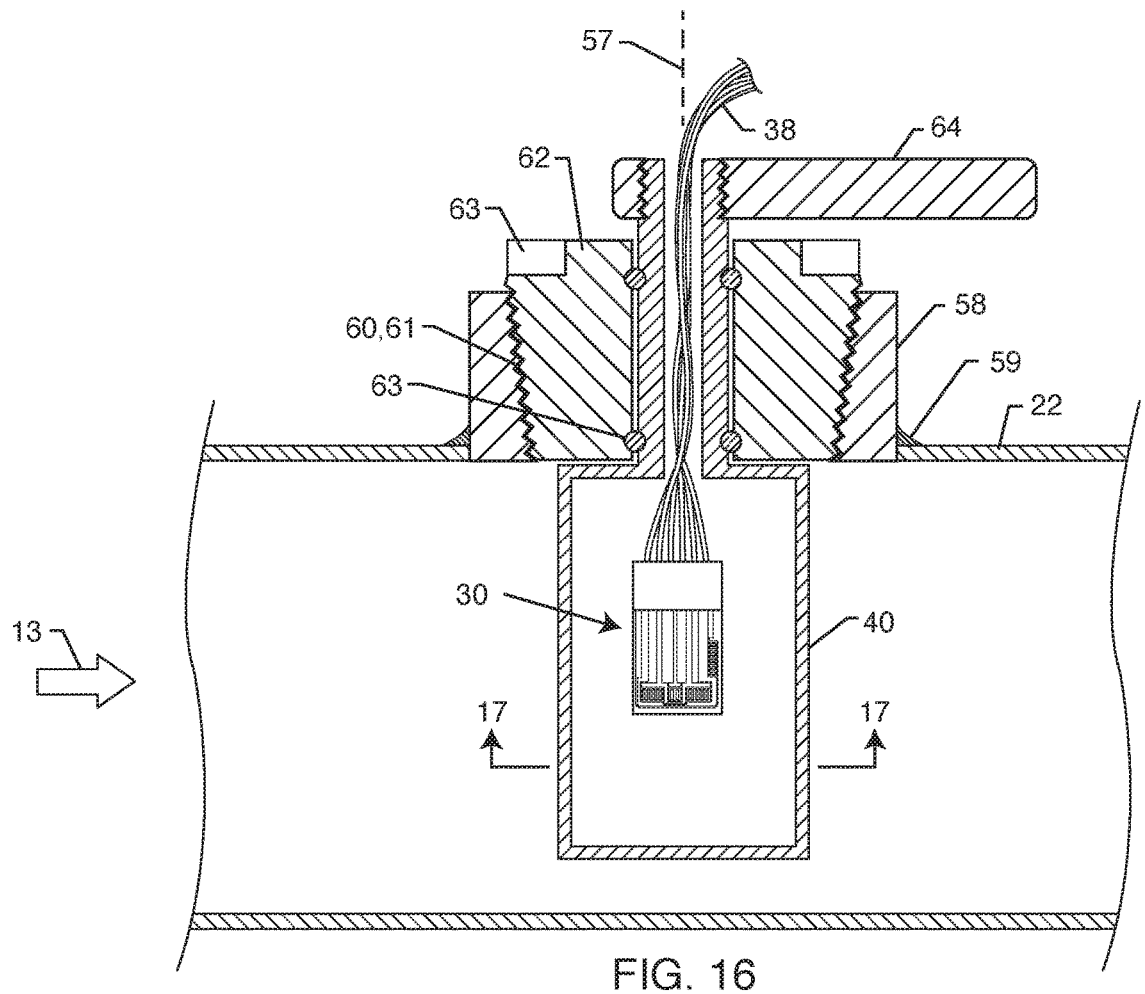
FIG. 16 is a sectional side view illustrating another embodiment of the structure of FIGS. 4 and 5 now mounted in a pipe portion utilizing a hydrodynamically shaped thermally conductive membrane.
Figure 17:
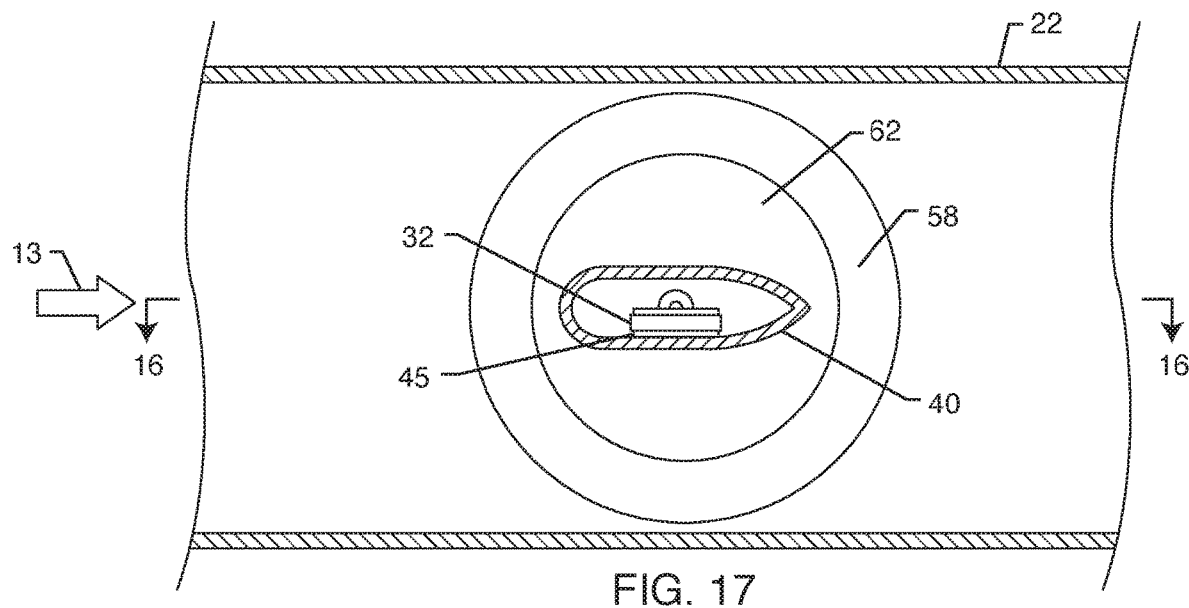
FIG. 17 is the sectional view taken along lines 17-17 from the structure of FIG. 16 better showing the shape of the hydrodynamically shaped thermally conductive membrane.

FIG. 16 is another embodiment of the present invention similar in nature to FIGS. 4-10. In this embodiment, the thermally conductive membrane 40 is formed as a hydrodynamically efficient structure such that its presence inside the pipe portion 22 allows the flow of liquid to pass over it to remain laminar and reduce the possibility of turbulence. The shape of the membrane 40 is best seen in FIG. 17 which is taken from the section 17-17 of FIG. 16. When looking at FIG. 16, one can see that the membrane 40 is shaped like a wing and/or torpedo. This shape allows the flow of liquid past it to remain laminar as turbulence across the thermally conductive membrane 40 may lead to errant readings and inconsistent performance. It is understood that the membrane 40 may be formed as the entire hydrodynamic shape or just as a portion of the overall hydrodynamic shape. Also, many hydrodynamically efficient shapes may be used and designed, as this disclosure is not to be limited to the exact form taught herein.

In another embodiment not shown, instead of using a conformal coating 53, the substrate 32 could be disposed on both sides of the circuits 35, 36, 37 thereby fully encapsulating the circuits from any fluid exposure. The thickness of the substrate on each side of the circuits could be the same, or one thickness could be dramatically larger or thinner than the other. For example, a normal thickness of the substrate 32 could be used to lay down the circuits 35, 36 and 37. Then, a thin layer of an overlaying substrate could be laid on top to thereby seal the circuits from fluid exposure. This thinner layer of substrate allows thermal energy to pass there through while not affecting the circuits functioning.

Another feature of this embodiment (that may be removed) is that the entire wing profile of the hydrodynamically shaped thermally conductive membrane 40 can be rotated about axis 57. Referring again to FIG. 16, one can see that a boss 58 has been welded 59 to the pipe portion 22. The boss 58 has a female-side pipe thread 60 that is matched to a male-side pipe 61 thread of a carrier 62. The carrier 62 has a seal 63 that prevents liquid from escaping the pipe portion. The carrier 62 may also include a hex head 63 for tightening the threads 60, 61. Attached to the membrane 40 at the top of the figure is a handle 64. The handle allows one to rotate the membrane 40 about the axis 57 such that the sensor 30 can be adjusted for accuracy. Adjusting the angle of the membrane 40 within the pipe portion may be beneficial for achieving laminar flow over the sensor 30 at the location where it is bonded to the membrane 40. As can be seen and understood by those skilled in the art, this embodiment is just one simplified example of the present invention, but the teachings taught and contained herein can be expanded and applied to various other structures in light of this disclosure.

Although several embodiments have been described in detail for purposes of illustration, various modifications may be made to each without departing from the scope and spirit of the invention. Accordingly, the invention is not to be limited, except as by the appended claims.

What is claimed is:

1. A flow sensor system configured to detect a fluid flow of a liquid inside a pipe portion, the fluid flow configured to move in a flow direction along a longitudinal axis of the pipe portion, the flow sensor system comprising:
   a thin film thermal mass flow sensor having a substrate defining a thickness from an upper side opposite a bottom side, the upper side of the substrate supporting a resistive heating circuit, a first temperature sensor circuit and a second temperature sensor circuit, where the resistive heating circuit is disposed between the first and second temperature sensor circuits, and where the circuits are electrically connected respectively to a plurality of leadwires configured to be attachable to electronic equipment; and
   a conformal coating disposed over the thin film thermal mass flow sensor, where the conformal coating is electrically insulative and thermally conductive;
   wherein the conformal coating is configured to be immersed within and in direct contact with the fluid flow of the liquid inside the pipe portion.

2. The flow sensor system of claim 1, wherein the thin film thermal mass flow sensor is configured to be oriented with respect to the flow direction where the fluid flow first reaches the first temperature sensor circuit, next reaches the resistive heating circuit and finally reaches the second temperature circuit.

3. The flow sensor system of claim 2, including the pipe portion, wherein a funnel is disposed inside the pipe portion and located upstream of the thin film thermal mass flow sensor.

4. The flow sensor system of claim 2, including the pipe portion, wherein a support structure holds the thin film thermal mass flow sensor at a center of the fluid flow of the liquid inside the pipe portion, the support structure not being disposed upstream of the circuits.

* * * * *